(12) United States Patent
Kim et al.

(10) Patent No.: US 12,101,554 B2
(45) Date of Patent: Sep. 24, 2024

(54) METHOD AND APPARATUS FOR PERFORMING AUTOFOCUSING USING SUMMED SIGNALS

(71) Applicant: SAMSUNG ELECTRONICS CO., LTD., Suwon-si (KR)

(72) Inventors: Jiyong Kim, Seoul (KR); Kwanghyun Lee, Hwaseong-si (KR); Jaejin Jung, Hwaseong-si (KR); Wontak Choi, Seoul (KR); Yeeun Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 94 days.

(21) Appl. No.: 17/952,674

(22) Filed: Sep. 26, 2022

(65) Prior Publication Data

US 2023/0171491 A1    Jun. 1, 2023

(30) Foreign Application Priority Data

Nov. 26, 2021   (KR) .......................... 10-2021-0165214
Mar. 15, 2022   (KR) .......................... 10-2022-0031768

(51) Int. Cl.
*H04N 23/67*      (2023.01)
*H04N 25/11*      (2023.01)

(52) U.S. Cl.
CPC .............. *H04N 23/67* (2023.01); *H04N 25/11* (2023.01)

(58) Field of Classification Search
CPC ...... H04N 23/67; H04N 25/11; H04N 23/672; H04N 23/673; H04N 25/134; H04N 25/40; H04N 25/46; H04N 25/583; H04N 25/585; H04N 25/704; H04N 25/79; H01L 27/14609; H01L 27/14621; H01L 27/14641; H01L 27/14627; H01L 27/1464
See application file for complete search history.

(56) References Cited

U.S. PATENT DOCUMENTS 10,073,239 B1   9/2018   Jung et al.
10,687,005 B2   6/2020   Canniff et al.
10,721,426 B2   7/2020   Kaibara
(Continued)

FOREIGN PATENT DOCUMENTS

EP   2 833 621 B1   10/2018
EP   3716618 A1    9/2020

OTHER PUBLICATIONS

Communication issued Mar. 20, 2023 by the European Patent Office for European Patent Application No. 22209442.7.

*Primary Examiner* — Gevell V Selby
(74) *Attorney, Agent, or Firm* — Sughrue Mion, PLLC

(57) ABSTRACT

An image sensor, including a pixel array including a first unit pixel including first a plurality of photodiodes and a second unit pixel including a second plurality of diodes; a readout circuit configured to: obtain a reset signal from the first unit pixel and the second unit pixel, obtain a first single pixel signal from a first photodiode of the first unit pixel, and a second single pixel signal from a second photodiode of the second unit pixel, and obtain a first summed pixel signal from the first unit pixel, and a second summed pixel signal from the second unit pixel, wherein the first photodiode is disposed in position with respect to the first unit pixel which is different from a position of the second photodiode with respect to the second unit pixel.

21 Claims, 23 Drawing Sheets

(56) References Cited

U.S. PATENT DOCUMENTS

| | | | |
|---|---|---|---|
| 2015/0312461 A1 | 10/2015 | Kim et al. | |
| 2017/0019584 A1 | 1/2017 | Ham | |
| 2018/0061878 A1* | 3/2018 | Nomura | H04N 25/76 |
| 2018/0205897 A1 | 7/2018 | Kim et al. | |
| 2018/0316881 A1* | 11/2018 | Arishima | H04N 25/75 |
| 2019/0371837 A1* | 12/2019 | Masagaki | H01L 27/14621 |
| 2020/0027914 A1 | 1/2020 | Lee | |
| 2020/0186723 A1* | 6/2020 | Kang | H04N 23/67 |
| 2021/0134865 A1 | 5/2021 | Shim et al. | |
| 2021/0185286 A1 | 6/2021 | Pang et al. | |
| 2021/0250529 A1 | 8/2021 | Baek et al. | |

* cited by examiner

METHOD AND APPARATUS FOR PERFORMING AUTOFOCUSING USING SUMMED SIGNALS

CROSS-REFERENCE TO RELATED APPLICATION(S)

This application is based on and claims priority under 35 U.S.C. § 119 to Korean Patent Application No. 10-2021-0165214 filed on Nov. 26, 2021 and Korean Patent Application No. 10-2022-0031768 filed on Mar. 15, 2022 in the Korean Intellectual Property Office, the disclosures of which are incorporated by reference herein in their entirety.

BACKGROUND

1. Field

Example embodiments of the present disclosure relate to an image sensor and an autofocusing method of the same.

2. Description of Related Art

An image sensor may be a semiconductor-based sensor receiving light and generating an electrical signal, and may include a pixel array having a plurality of pixels, and a logic circuit for driving the pixel array and generating an image. Each of the pixels may include a photodiode, and a pixel circuit converting electric charges generated by the photodiode into an electric signal. An image sensor may be widely applied to smartphones, tablet PCs, laptop computers, televisions, automobiles, and the like, in addition to cameras for taking pictures or videos. Recently, along with research to improve autofocusing performance, research to create an image having high quality has been conducted.

SUMMARY

Provided is an image sensor which may perform autofocusing while reducing a decrease in a frame rate by reducing the number of times a readout operation accompanying autofocusing is performed.

Additional aspects will be set forth in part in the description which follows and, in part, will be apparent from the description, or may be learned by practice of the presented embodiments.

In accordance with an aspect of the disclosure, an image sensor includes a pixel array including a plurality of unit pixels arranged in parallel with an upper surface of a substrate, the substrate including a lower surface opposite to the upper surface, wherein each unit pixel of the plurality of unit pixels includes a color filter disposed on the upper surface, and a microlens disposed on the color filter, and wherein in the each unit pixel, the substrate includes a plurality of photodiodes in a 2×2 arrangement divided by a device isolation film; a logic circuit including a readout circuit configured to: obtain a reset signal from the each unit pixel, obtain a single pixel signal from a photodiode of the plurality of photodiodes included in the each unit pixel, and obtain a summed pixel signal from the each unit pixel, wherein the photodiode for obtaining the single pixel signal is disposed in different positions in the plurality of unit pixels.

In accordance with an aspect of the disclosure, an image sensor includes a pixel array including a plurality of unit pixels arranged in parallel with an upper surface of a substrate, the substrate including a lower surface opposite to the upper surface, wherein each unit pixel of the plurality of unit pixels includes a color filter disposed on the upper surface, and a microlens disposed on the color filter, and wherein in the each unit pixel, the substrate includes a plurality of photodiodes in a 2×2 arrangement divided by a device isolation film; a logic circuit including a readout circuit configured to: obtain a reset signal from the each unit pixel, obtain a single pixel signal from a photodiode of the plurality of photodiodes included in the each unit pixel, obtain a dual pixel signal from two adjacent photodiodes from among the plurality of photodiodes included in the each unit pixel, and obtain a summed pixel signal from the each unit pixel, wherein the readout circuit includes an analog-to-digital converter configured to convert the single pixel signal into a first digital signal, to convert the dual pixel signal into a second digital signal, and to convert the summed pixel signal into a third digital signal, and wherein a magnitude of the first digital signal and a magnitude of the second digital signal are smaller than a magnitude of the third digital signal.

In accordance with an aspect of the disclosure, an image sensor includes a pixel array including a plurality of unit pixels arranged in parallel with a upper surface of a substrate, wherein, in each unit pixel of the plurality of unit pixels, the substrate includes a plurality of photodiodes in a 2×2 arrangement divided by a device isolation film; a logic circuit configured to: perform an operation of reading out the plurality of unit pixels in a first mode in which a floating diffusion region of the each unit pixel has a first capacitance, and perform the operation of reading out the plurality of unit pixels in a second mode in which the floating diffusion region of the each unit pixel has a second capacitance greater than the first capacitance, wherein the logic circuit includes a readout circuit configured to: obtain a reset signal in the first mode in sequence with a reset signal in the second mode, obtain a single pixel signal from a photodiode of the plurality of photodiodes included in the each unit pixel in the first mode, obtain a first summed pixel signal from the each unit pixel in the first mode, and obtain a second summed pixel signal from the each unit pixel in the second mode.

In accordance with an aspect of the disclosure, an autofocusing method of an image sensor includes obtaining a reset signal from a plurality of unit pixels including a first unit pixel, a second unit pixel, a third unit pixel, and a fourth unit pixel arranged in parallel with an upper surface of a substrate using a readout circuit, wherein each unit pixel of the plurality of unit pixels includes first to fourth photodiodes in a 2×2 arrangement divided by a device isolation film; obtaining single pixel signals from a second photodiode of the first unit pixel, a first photodiode of the second unit pixel, a fourth photodiode of the third unit pixel, and a third photodiode of the fourth unit pixel; obtaining a summed pixel signal from the each unit pixel; and performing an autofocusing operation in upward direction, a downward direction, a left direction, and a right direction based on the single pixel signals and the summed pixel signal.

In accordance with an aspect of the disclosure, an autofocusing method of an image sensor includes obtaining a first reset signal from a plurality of unit pixels, wherein each unit pixel of the plurality of unit pixels includes a plurality of photodiodes in a 2×2 arrangement divided by a divide isolation film and sharing a floating diffusion region, in a first mode in which the floating diffusion region has a first capacitance; changing the first mode to a second mode in which the floating diffusion region has a second capacitance; obtaining a second reset signal from the plurality of unit pixels in the second mode; changing the second mode to the first mode; obtaining single pixel signals from photodiodes disposed in different positions in the plurality of unit pixels in the first mode; obtaining a first summed pixel signal from the each unit pixel in the first mode; changing the first mode to the second mode; obtaining a second summed pixel signal from the each unit pixel in the second mode; and performing an autofocusing operation in upward direction, a downward direction, a left direction, and a right direction based on the single pixel signals.

In accordance with an aspect of the disclosure, an image sensor includes pixel array including a first unit pixel including a first plurality of photodiodes and a second unit pixel including a second plurality of photodiodes; a readout circuit configured to: obtain a reset signal from the first unit pixel and the second unit pixel, obtain a first single pixel signal from a first photodiode of the first unit pixel, and a second single pixel signal from a second photodiode of the second unit pixel, and obtain a first summed pixel signal from the first unit pixel, and a second summed pixel signal from the second unit pixel, wherein the first photodiode is disposed in position with respect to the first unit pixel which is different from a position of the second photodiode with respect to the second unit pixel.

BRIEF DESCRIPTION OF DRAWINGS

The above and other aspects, features, and advantages of certain embodiments of the present disclosure will be more apparent from the following detailed description, taken in combination with the accompanying drawings, in which.

DETAILED DESCRIPTION

Figure 1:
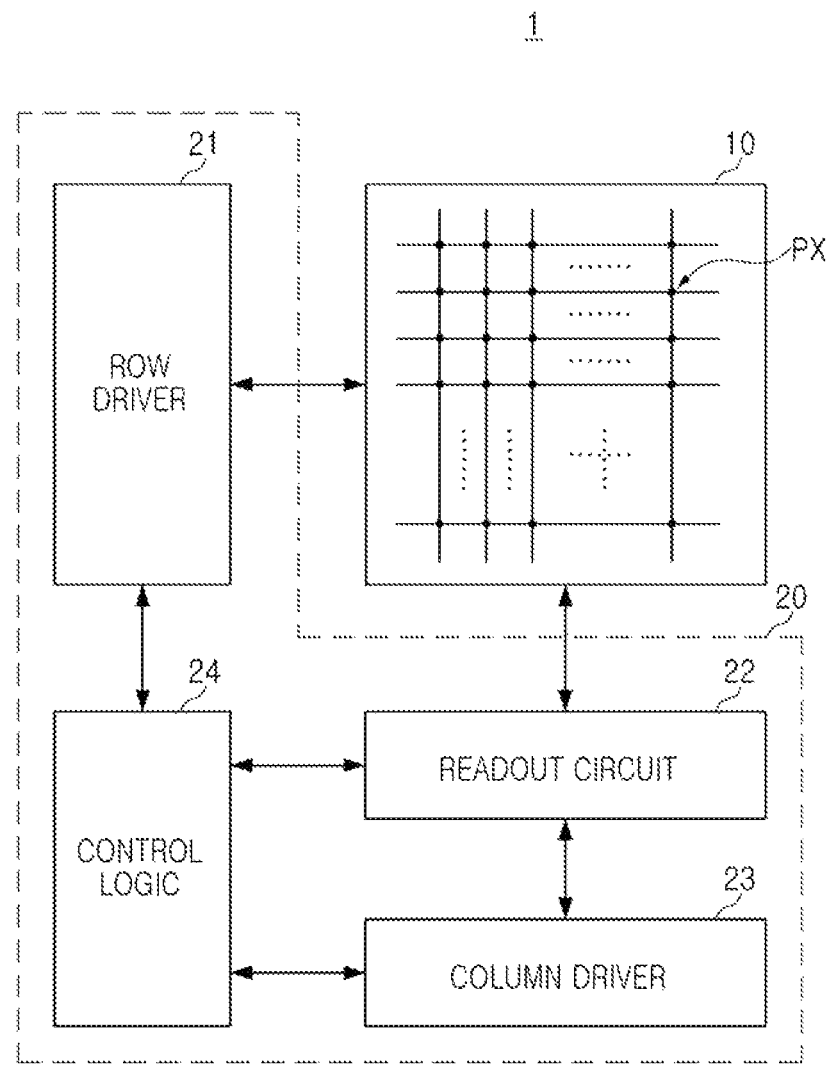
FIG. 1 is a block diagram illustrating an image sensor according to an embodiment.

Hereinafter, embodiments of the present disclosure will be described as follows with reference to the accompanying drawings.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c FIG. 1 is a block diagram illustrating an image sensor according to an example embodiment.

Referring to FIG. 1, an image sensor 1 in an example embodiment may include a pixel array 10 and a logic circuit 20.

The pixel array 10 may include a plurality of unit pixels PX arranged in an array form along a plurality of rows and a plurality of columns. Each of the plurality of unit pixels PX may include at least one photoelectric conversion device generating electric charges in response to light, and a pixel circuit generating a pixel signal corresponding to electric charges generated by the photoelectric conversion device.

The photoelectric conversion device may include a photodiode formed of a semiconductor material, and/or an organic photodiode formed of an organic material. In the image sensor 1 in an example embodiment, each of the plurality of unit pixels PX may include a plurality of photoelectric conversion devices arranged in 2×2 form, and the photoelectric conversion device included in the unit pixel PX may generate electric charges by receiving light. In an example embodiment, each of the plurality of unit pixels PX may include a photodiode receiving light and generating electric charges. However, embodiments are not limited thereto.

In an example embodiment, the plurality of unit pixels PX may be configured as autofocusing pixels for the image sensor 1 to perform an autofocusing function. However, embodiments are not limited thereto. For example, the plurality of unit pixels PX may include a plurality of autofocusing pixels, and may further include a plurality of normal pixels.

In example embodiments, the pixel circuit may include a transfer transistor, a driver transistor, a select transistor, and a reset transistor. When each of the unit pixels PX includes a plurality of photoelectric conversion devices, each of the unit pixels PX may include a pixel circuit for processing electric charges generated by the plurality of photoelectric conversion devices.

Each of the plurality of unit pixels PX included in the image sensor 1 in an example embodiment may include four photodiodes arranged in 2×2 form. Accordingly, a pixel circuit corresponding to each of the unit pixels PX may include a transfer transistor, a driver transistor, a select transistor, and a reset transistor corresponding to the photodiodes, respectively.

However, embodiments are not limited thereto. For example, the plurality of unit pixels PX included in the image sensor 1 may share a floating diffusion region in a predetermined group unit or a unit smaller than the predetermined group unit, and accordingly, at least a portion of the photodiodes may share a portion of a driver transistor, a select transistor, and a reset transistor.

The logic circuit 20 may include circuits for controlling the pixel array 10. For example, the logic circuit 20 may include a row driver 21, a readout circuit 22, a column driver 23, and a control logic 24. The row driver 21 may drive the pixel array 10 by a row unit. For example, the row driver 21 may generate a transfer control signal for controlling a transfer transistor of the pixel circuit, a reset control signal for controlling the reset transistor, a select control signal for controlling the select transistor, and may input the signals in the pixel array 10 by a row unit.

The readout circuit 22 may include a correlated double sampler (CDS) and an analog-to-digital converter (ADC). The correlated double samplers may be connected to the unit pixels PX through column lines. The correlated double samplers may perform correlated double sampling by receiving pixel signals from unit pixels PX connected to a row line selected by a row line selection signal of the row driver 21. The pixel signal may be received through the column lines. The analog-to-digital converter may convert a pixel signal detected by the correlated double sampler into a digital pixel signal and may transmit the signal to the column driver 23.

In the image sensor 1 in an example embodiment, the magnitude of the digital pixel signal transmitted by the analog-to-digital converter to the column driver 23 may vary according to the pixel signal. Accordingly, the image sensor 1 may further reduce the frame rate reduction by increasing a processing speed of the analog-to-digital converter.

The column driver 23 may include an amplifier circuit and a latch or buffer circuit temporarily storing a digital pixel signal, and may process a digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23.

Among the unit pixels PX, unit pixels PX disposed in the same position in the left and right directions may share the same column line. For example, unit pixels PX disposed in the same position in the upward and downward directions may be simultaneously selected by the row driver 21 and may output pixel signals through column lines. In an example embodiment, the readout circuit 22 may simultaneously obtain pixel signals from the unit pixels PX selected by the row driver 21 through column lines. The pixel signal may include a reset voltage and a pixel voltage, and the pixel voltage may be implemented as a voltage obtained by reflecting electric charges generated in response to light in each of the unit pixels PX in a reset voltage. However, embodiments are not limited thereto, and the image sensor may additionally include other components and may be driven in various manners.

The image sensor 1 may drive the plurality of unit pixels PX in units of one row line, or units of a plurality of row lines. For example, the image sensor 1 may drive a selected row line as aa driving line among the row lines and may read a reset voltage and a pixel voltage from the unit pixels PX connected to the driving line. In this case, a time period taken to read the reset voltage and the pixel voltage by driving the selected driving line may be defined as a horizontal period. The image sensor 1 may operate by a rolling shutter method of sequentially driving row lines. In embodiments, the image sensor 1 may drive the plurality of unit pixels PX in units of a plurality of row lines.

A frame period of the image sensor 1 may be defined as a time period required to read a reset voltage and a pixel voltage from the entire unit pixels PX included in the pixel array 10. For example, the frame period may be equal to or greater than a product of the number of row lines and the horizontal period. As the frame period of the image sensor 1 decreases, the image sensor 1 may generate a larger number of image frames during the same time period.

To perform an autofocusing operation in the image sensor 1, the pixel signal may be read multiple times, which may increase the frame period of the image sensor 1. The image sensor 1 in an example embodiment may reduce this increased frame period by reducing the number of readings of the pixel signal required to perform the autofocusing operation. Accordingly, the image sensor 1 in an example embodiment may reduce the frame rate reduction, may reduce power consumption, and may obtain autofocusing information in multiple directions, which may be for example overall directions or all relevant directions, for example one or more of an upward direction, a downward direction, a rightward direction, and a leftward direction.

In example embodiments, the logic circuit 20 and the pixel array 10 may be formed on different semiconductor substrates, and the semiconductor substrates may be stacked.

Figure 2:
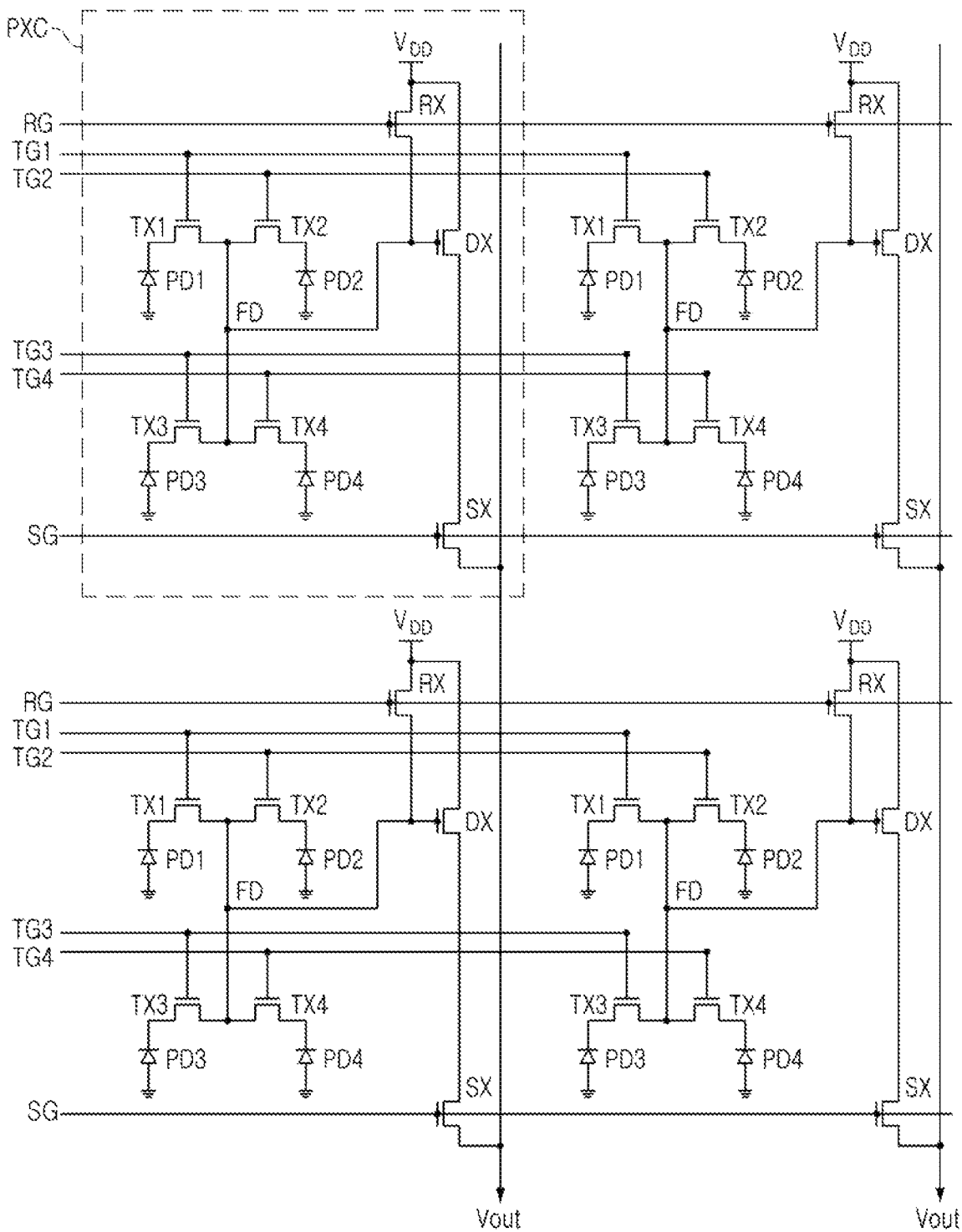
FIG. 2 is a circuit diagram illustrating an image sensor according to an embodiment.

FIG. 2 is a circuit diagram illustrating an image sensor according to an example embodiment.

Referring to FIG. 2, a plurality of unit pixels PX included in the image sensor 1 in an example embodiment may include a pixel circuit PXC corresponding to the plurality of unit pixels PX, respectively. The pixel circuit PXC may include a first photodiode PD1, a second photodiode PD2, a third photodiode PD3, and a fourth photodiode PD4 included in the plurality of unit pixels PX, respectively, and a plurality of semiconductor devices for processing electric charges generated by the photodiodes PD1, PD2, PD3, and PD4. The pixel circuit PXC may include first transfer transistor TX1, second transfer transistor TX2, third transfer transistor TX3, and fourth transfer transistor TX4 corresponding to the plurality of photodiodes PD1, PD2, PD3, and PD4, respectively, a reset transistor RX, and a select transistor SX, and a driver transistor DX. The photodiodes PD1, PD2, PD3, and PD4 included in the pixel circuit PXC may share a floating diffusion region FD, along with the reset transistor RX, the select transistor SX, and the driver transistor DX.

Gate electrodes of the plurality of transistors TX1, TX2, TX3, TX4, RX, SX, and DX included in the pixel circuit PXC may be connected to driving signal lines, respectively. For example, the first to fourth transfer transistors TX1, TX2, TX3, and TX4 may operate by receiving transfer control signals TG1, TG2, TG3, and TG4 from a transfer control signal line, the reset transistor RX may operate by receiving the reset control signal RG from a reset control signal line, and the select transistor SX may operate by receiving a select control signal SG. However, embodiments are not limited thereto, and the pixel circuit may be configured in various manners. For example, the pixel circuit may include semiconductor devices for processing electric charges generated by the photodiode by units larger or smaller than the unit pixel PX.

In an example embodiment, one of the pixel circuits PXC may generate a first electrical signal from electric charges generated by the photodiodes PD1, PD2, PD3, and PD4 included in the corresponding pixel circuit PXC and may output the signal to the first column line, and another pixel circuit may generate a second electrical signal from electric charges generated by the photodiodes PD1, PD2, PD3, and PD4 included in the pixel circuit to the second column line. In example embodiments, two or more pixel circuits disposed adjacent to each other may share a single first column line. Similarly, two or more different pixel circuits disposed adjacent to each other may share a single second column line. Pixel circuits disposed adjacent to each other may share a portion of semiconductor devices.

The first to fourth transfer transistors TX1, TX2, TX3, and TX4 may be connected to the first to fourth photodiodes PD1, PD2, PD3, and PD4, respectively. The first to fourth transfer transistors TX1, TX2, TX3, and TX4 may share the floating diffusion region FD. The first to fourth photodiodes PD1, PD2, PD3, and PD4 may generate electric charges in proportion to the amount of incident light and may accumulate electric charges in each of the photodiodes.

The first to fourth transfer transistors TX1, TX2, TX3, and TX4 may transfer electric charges accumulated in the first to fourth photodiodes PD1, PD2, PD3, and PD4 to the floating diffusion region FD in sequence, respectively. To transfer electric charges generated in one of the first to fourth photodiodes PD1, PD2, PD3, and PD4 to the floating diffusion region FD, different transfer control signals TG1, TG2, TG3, and TG4 may be applied to gate electrodes of the first to fourth transfer transistors TX1, TX2, TX3, TX4. Accordingly, the floating diffusion region FD may accumulate electric charges generated by at least one of the first to fourth photodiodes PD1, PD2, PD3, and PD4.

The reset transistor RX may periodically reset electric charges accumulated in the floating diffusion region FD. For example, electrodes of the reset transistor RX may be connected to the floating diffusion region FD and the power supply voltage VDD. When the reset transistor RX is turned on, electric charges accumulated in the floating diffusion region FD may be discharged due to a difference in potential from the power supply voltage VDD and the floating diffusion region FD may be reset, and the floating diffusion region FD may be equalized to the power supply voltage VDD.

Operation of the driver transistor DX may be controlled according to the amount of charge accumulated in the floating diffusion region FD. The driver transistor DX may work as a source-follower buffer amplifier in combination with a current source disposed externally of the unit pixel PX. For example, a potential change caused by the accumulation of electric charges in the floating diffusion region FD may be amplified and outputted to the output line Vout.

The select transistor SX may select the unit pixels PX to be read by row units. When the select transistor SX is turned on, an electrical signal output by the driver transistor DX may be transmitted to the select transistor SX.

The image sensor 1 in an example embodiment may provide an autofocusing function in at least one of a plurality of unit pixels based on the pixel circuit illustrated in FIG. 2. For example, the image sensor 1 may provide an autofocusing function in four directions (e.g., upward and downward directions and left and right directions) using the first photodiode PD1 to the fourth photodiode PD4.

For example, the logic circuit may provide an autofocusing function in upward and downward directions using pixel signals obtained from the first photodiode PD1 and the second photodiode PD2, and pixel signals obtained from the third photodiode PD3 and the fourth photodiode PD4. The logic circuit may provide an autofocusing function in the left and right directions using pixel signals obtained from the first photodiode PD1 and the third photodiode PD3 and pixel signals obtained from the second photodiode PD2 and the fourth photodiode PD4. However, the pixel circuit of the unit pixel providing the autofocusing function is not necessarily limited to the example illustrated in FIG. 2, and a portion of devices may be added or may not be provided if desired.

Figure 3:
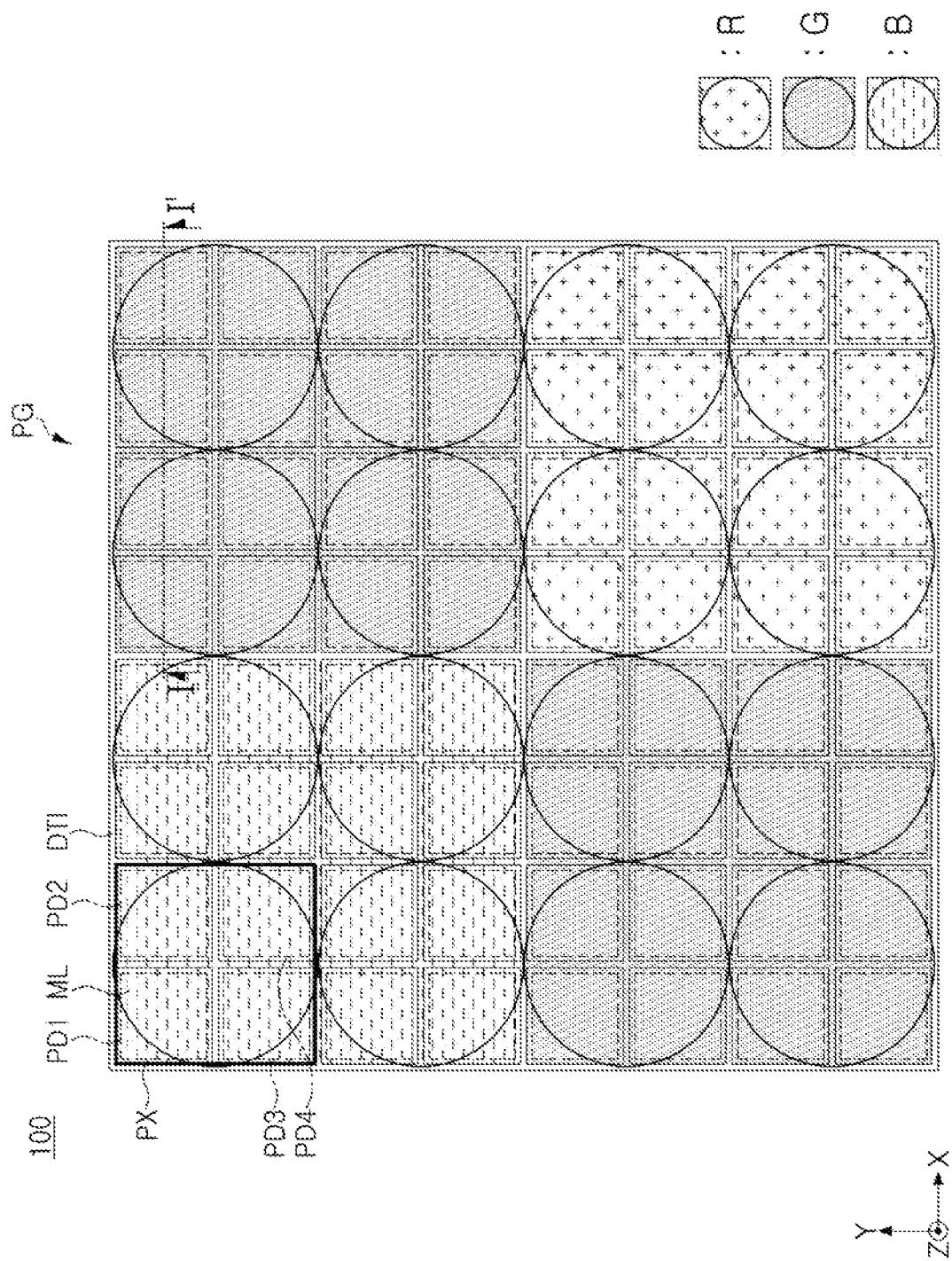
FIG. 3 is a plan diagram illustrating unit pixels included in an image sensor according to an embodiment.

FIG. 3 is a plan diagram illustrating unit pixels included in an image sensor according to an example embodiment.

Referring to FIG. 3, the image sensor 100 in an example embodiment may include a plurality of pixel groups PG each including a plurality of unit pixels PX arranged in a 4×4 form.

The plurality of unit pixels PX included in the image sensor 100 may include the pixel circuit PXC illustrated in FIG. 2. For example, each of the plurality of unit pixels PX may include photodiodes PD1, PD2, PD3, and PD4 arranged in 2×2 form. The plurality of unit pixels PX may be defined by a device isolation film DTI disposed therebetween, and each of the plurality of unit pixels PX isolated by the device isolation film DTI may include a photodiode.

A plurality of unit pixels PX included in the image sensor 100 may correspond to a color filter of the same color for each 2×2 array, and a microlens ML corresponding to the plurality of unit pixels PX may be disposed on the color filter. The microlens ML may be disposed on an uppermost portion of the plurality of unit pixels PX in the first direction (e.g., the Z direction) and may allow external light to be incident into the pixel.

Referring to FIG. 3, arrangement of a color filter may correspond to a pixel group PG. For example, the color filters may be repeatedly arranged in the order of blue, green, green, and red to correspond to the plurality of pixel groups PG arranged in 2×2 form.

However, the configuration of the image sensor 100 may not be limited to the example illustrated in FIG. 3. As an example, the arrangement of color filters may be varied. For example, a white color filter may be included in the arrangement of color filters. As another example, the arrangement of color filters may include an arrangement of a cyan color filter, a magenta color filter, and a yellow color filter.

Figure 4:
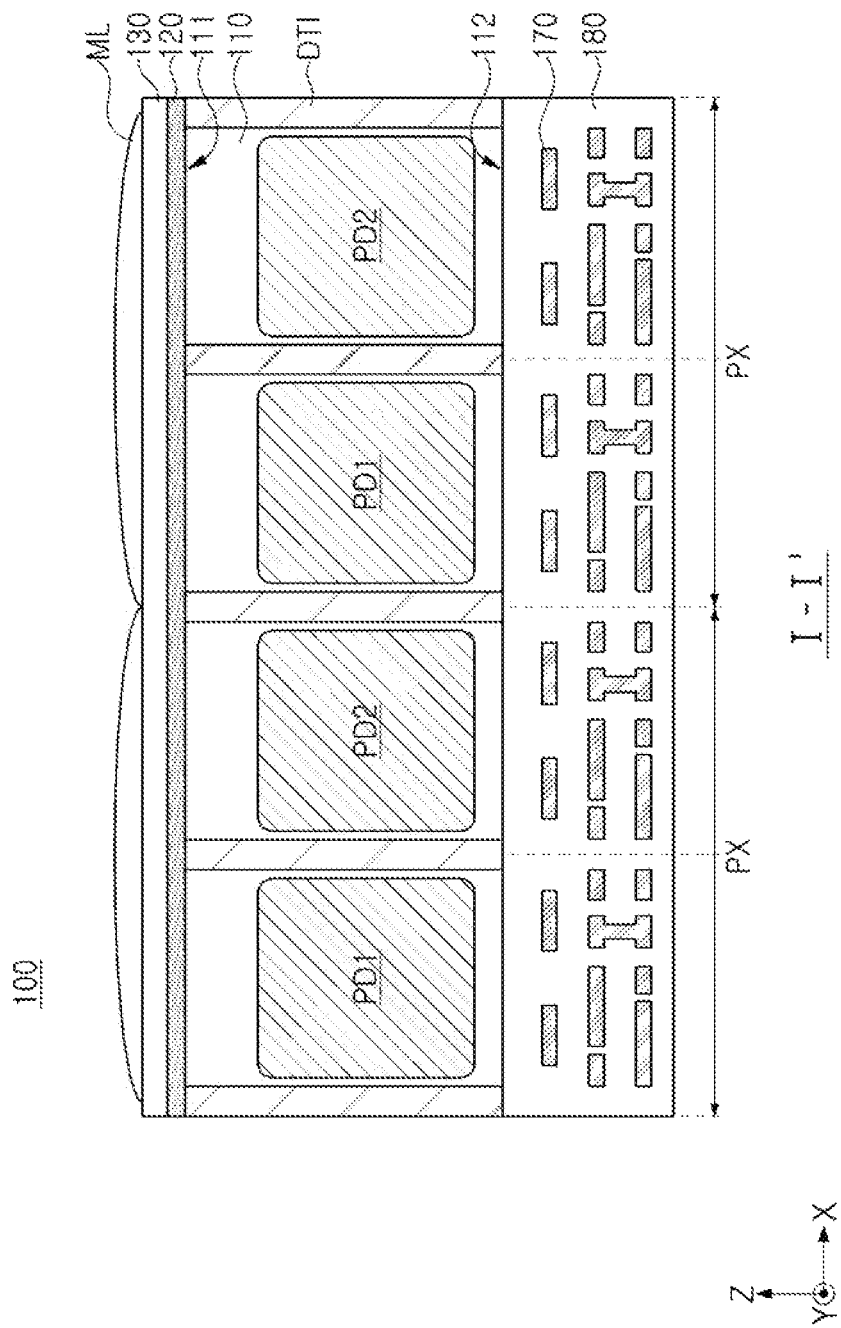
FIG. 4 is a cross-sectional diagram illustrating unit pixels included in an image sensor according to an embodiment.

FIG. 4 is a cross-sectional diagram illustrating unit pixels included in an image sensor according to an example embodiment.

FIG. 4 may be a cross-sectional diagram illustrating the image sensor 100 in FIG. 3 taken along line I-I'. Referring to FIG. 4, the image sensor 100 may include a substrate 110 including a first surface 111 and a second surface 112 opposing each other, photodiodes PD1 and PD2 disposed in each of the plurality of unit pixels PX, and a device isolation film DTI disposed between the plurality of unit pixels PX.

In the image sensor 100 in an example embodiment, a color filter 120, the a transmitting layer 130, and a microlens ML may be disposed in sequence on the first surface 111 of the substrate 110. For example, in the unit pixels PX illustrated in FIG. 4, the color filter 120 may be green, and the microlens ML may correspond to each of the unit pixels PX.

In the image sensor 100 in an example embodiment, the plurality of unit pixels PX arranged in a direction parallel to the first surface 111 may be configured as autofocusing pixels. Light incident through the microlens ML may be incident to the photodiodes PD1 and PD2 included in each of the plurality of unit pixels PX. As described above, the plurality of unit pixels PX of the image sensor 100 in an example embodiment may obtain pixel signals from the corresponding photodiodes PD1 and PD2, respectively, and may perform an autofocusing operation.

In the image sensor 100, a pixel circuit may be disposed below the photodiode. For example, the pixel circuit may include wiring patterns 170 and an insulating layer 180 covering the wiring patterns 170, and may be disposed on the second surface 112 of the substrate 110.

In embodiments, the pixel circuit may include a plurality of devices including a transfer transistor, and a floating diffusion region. The pixel circuit may operate to obtain a pixel signal from the plurality of unit pixels PX. In this case, the plurality of devices may be configured as transfer transistors adjacent to the floating diffusion region. A gate of each of the transfer transistors may have a vertical structure in which at least a partial region is embedded in the substrate 110.

Figure 5:
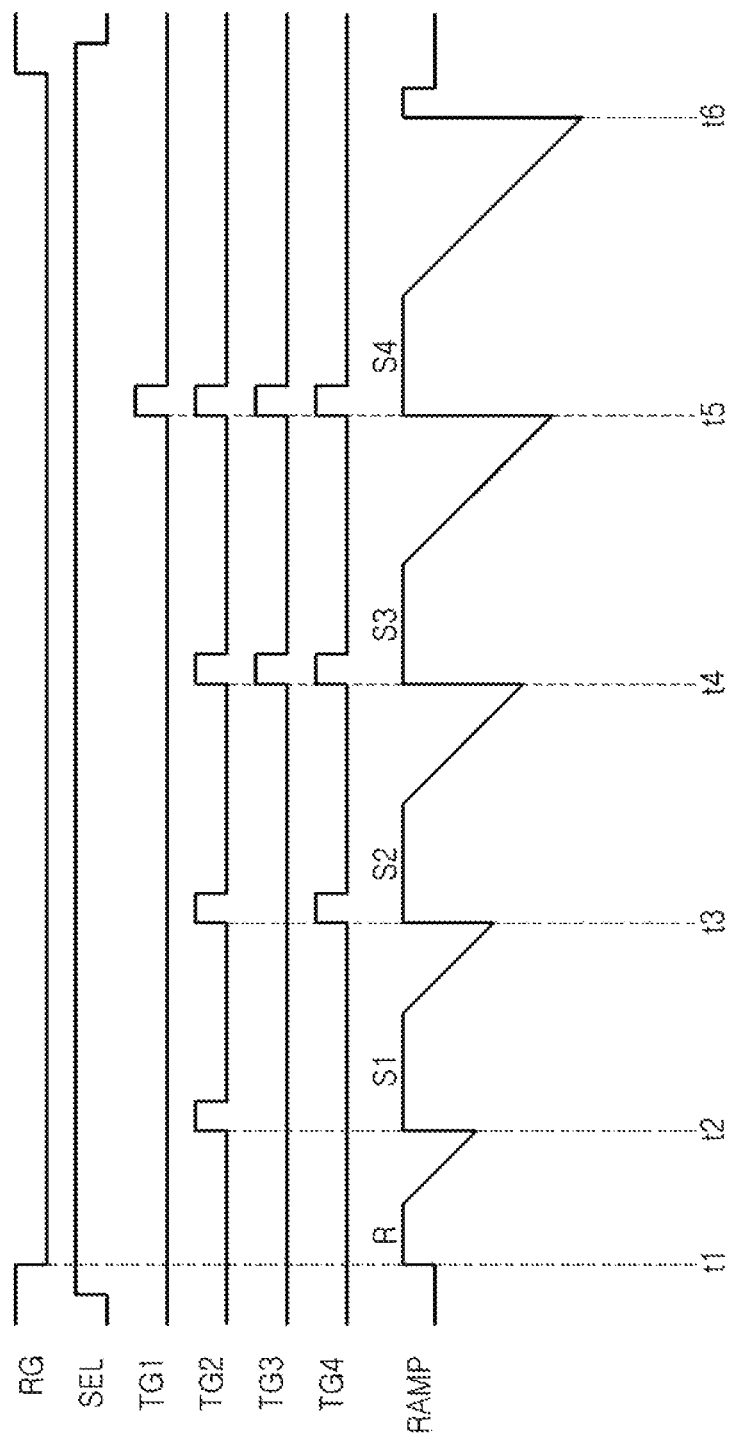
FIG. 5 is a waveform diagram illustrating an autofocusing operation of an image sensor according to an embodiment.
Figure 6:
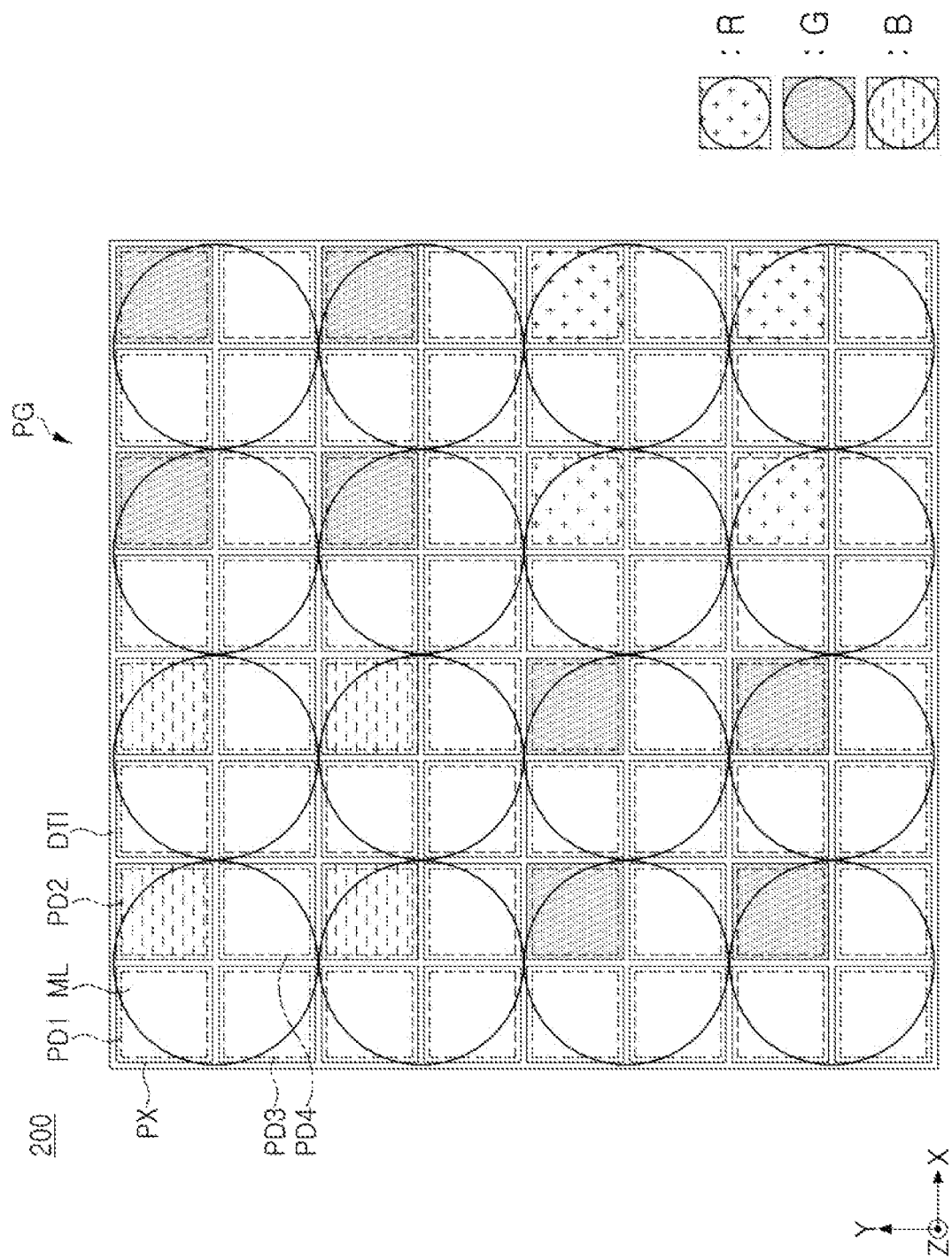
FIGS. 6 to 8 are plan diagrams illustrating an autofocusing operation of an image sensor according to an embodiment.
Figure 7:
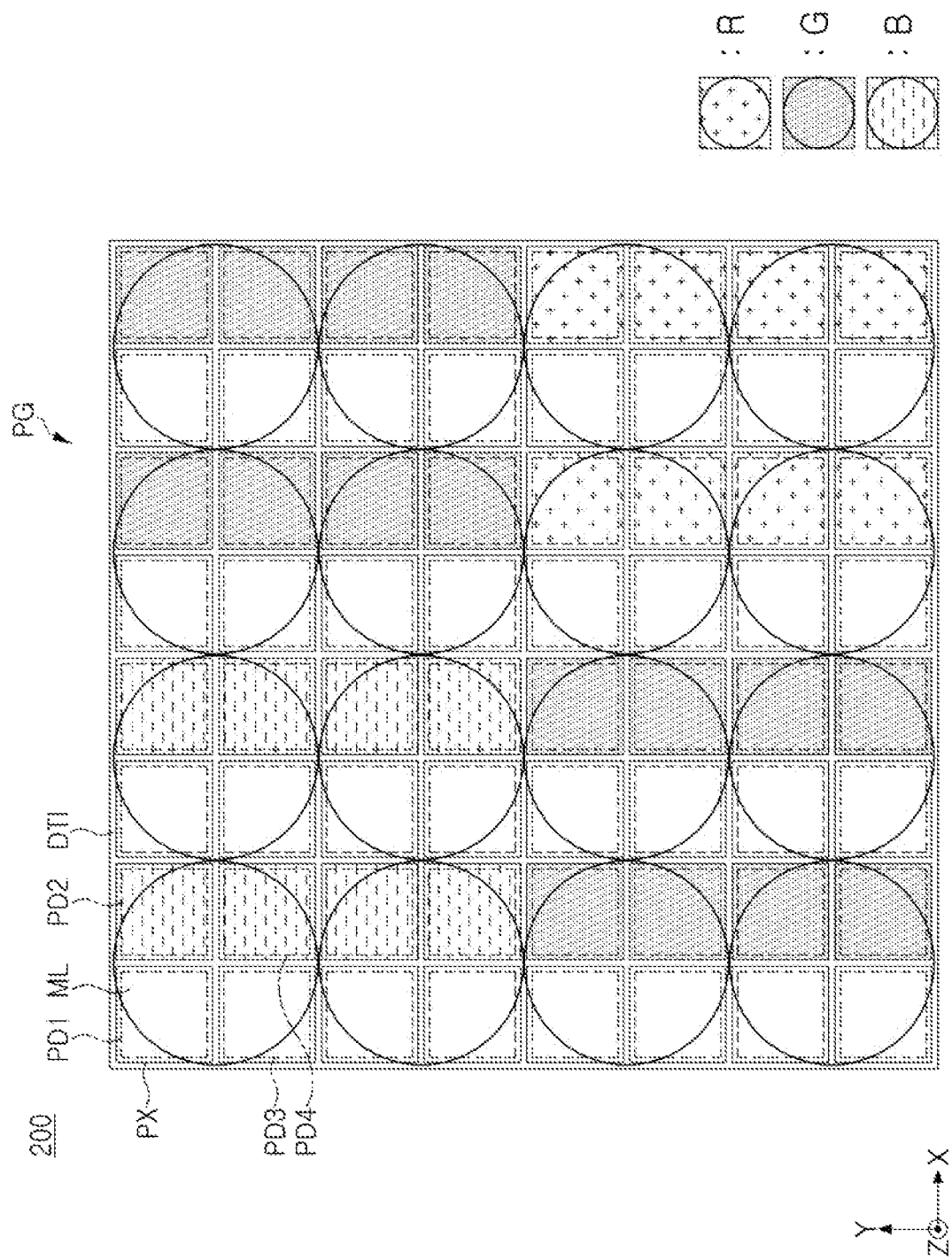
Figure 8:
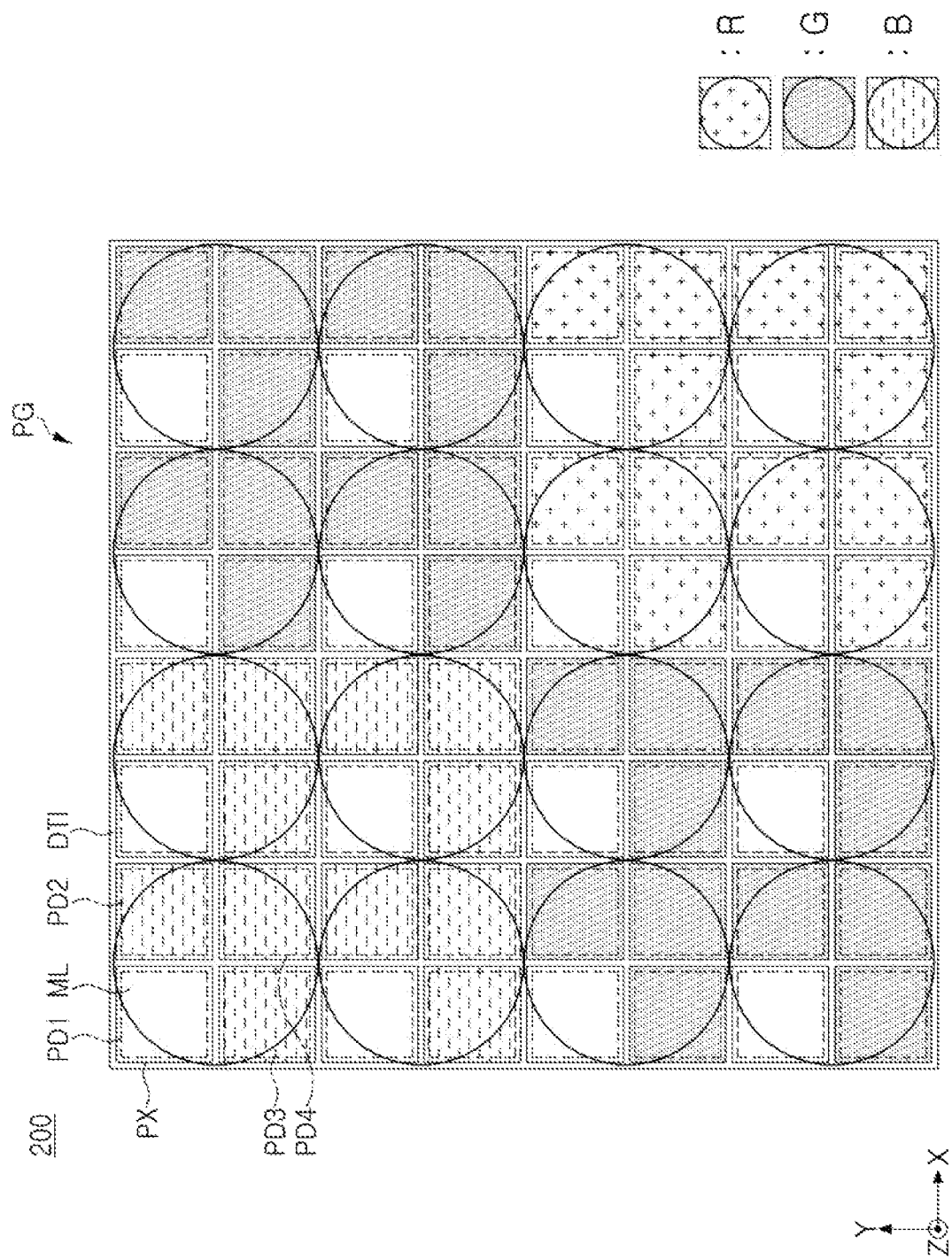

FIG. 5 is a waveform diagram illustrating an autofocusing operation of an image sensor according to an example embodiment. FIGS. 6 to 8 are plan diagrams illustrating an autofocusing operation of an image sensor according to an example embodiment.

Referring to FIGS. 5 to 8, an autofocusing operation in an image sensor 200 in which each of the plurality of unit pixels PX may include four photodiodes PD1, PD2, PD3, and PD4 may be performed by obtaining pixel signals from each of the photodiodes PD1, PD2, PD3, and PD4. That is, after reading out the reset signal, the image sensor 200 may operate in an RSSSS mode in which a pixel signal is read out four times.

Referring to FIG. 5, in the image sensor 200, the reset transistor may be turned on while a reset control signal RG is activated, such that a voltage of the floating diffusion region may be reset by a power supply voltage.

In a time period between t1 and t2, the logic circuit may perform a reset operation R. The reset operation R may be defined as an operation of obtaining a reset signal of the reset floating diffusion region. For example, when a voltage of the floating diffusion region is reset, the select transistor may be turned on by activating the select control signal SEL, and the reset transistor may be turned off by deactivating the reset control signal RG, such that the readout circuit may read the reset voltage from the pixel. For example, the reset signal may correspond to a decrease of the ramp voltage RAMP that is linearly reduced in response to the deactivation of reset control signal RG.

Referring to FIGS. 5 and 6 together, in a time period between t2 and t3, the logic circuit may perform a first operation S1 of obtaining a first pixel signal. During the first operation S1, the readout circuit may move electric charges of one of the photodiodes PD1, PD2, PD3, and PD4 to the floating diffusion region, and may read the first pixel signal from the corresponding electrical charge.

For example, in the time period between t2 and t3, the logic circuit may obtain a first pixel signal from electric charges stored in the second photodiode PD2 by activating the second transfer control signal TG2 applied to the second transfer transistor connected to the second photodiode PD2. However, embodiments are not limited thereto, and the first pixel signal may be obtained from electric charges stored in one of the photodiodes PD1, PD3, and PD4 other than the second photodiode PD2. For example, the first pixel signal may correspond to a decrease of the ramp voltage RAMP that is linearly reduced in response to the activation of the second transfer control signal TG2.

Referring to FIGS. 5 and 7, in the time period between t3 and t4, the logic circuit may perform a second operation S2 of obtaining a second pixel signal. During the second operation S2, the readout circuit may move electric charges of a photodiode based on obtaining the first pixel signal during the first operation S1 and another photodiode adjacent thereto to the floating diffusion region, and may read a second pixel signal from the electric charges.

For example, in the time period between t3 and t4, the logic circuit may obtain the second pixel signal from electric charges stored in the second photodiode PD2 and the fourth photodiode PD4 by activating a second transfer control signal TG2 applied to a second transfer transistor connected to the second photodiode PD2, and a fourth transfer control signal TG4 applied to the fourth transfer transistor connected to the fourth photodiode PD4 adjacent to the second photodiode PD2. For example, the second pixel signal may correspond to a decrease of the ramp voltage RAMP that is linearly reduced in response to the activation of the second transfer control signal TG2 and the fourth transfer control signal TG4.

Referring to FIGS. 5 and 8 together, in the time period between t4 and t5, the logic circuit may perform a third operation S3 of obtaining a third pixel signal. During the third operation S3, the readout circuit may move electric charges of the photodiodes and the other photodiode based on obtaining the second pixel signal during the second operation S2 to the floating diffusion region, and may read a third pixel signal the electric charges.

For example, in the time period between t4 and t5, the logic circuit may obtain a third pixel signal from electric charges stored in the second photodiode PD2, the third photodiode PD3, and the fourth photodiode PD4 by activating the second transfer control signal TG2 applied to a second transfer transistor connected to the second photodiode PD2, a fourth transfer control signal TG4 applied to the fourth transfer transistor connected to the fourth photodiode PD4, and the third transfer control signal TG3 applied to the third transfer transistor connected to the third photodiode PD3. For example, the third pixel signal may correspond to a decrease of the ramp voltage RAMP that is linearly reduced in response to the activation of the transfer control signals TG2, TG3 and TG4.

Referring to FIG. 5, in the time period between t5 and t6, the logic circuit may perform a fourth operation S4 of obtaining a fourth pixel signal. The fourth pixel signal obtained by the fourth operation S4 may be configured as a summed pixel signal based on electric charges of entirety of the photodiodes PD1, PD2, PD3, and PD4.

The image sensor 200 may obtain autofocusing information in multiple directions, for example upward, downward, left, and right directions, based on pixel signals obtained by readout operations in RS1S2S3S4 mode. However, as the number of performing the readout operation increases, the number of operations of the analog-to-digital converter may also increase, and accordingly, a frame rate may decrease. For example, the fourth pixel signal may correspond to a decrease of the ramp voltage RAMP that is linearly reduced in response to the activation of the transfer control signals TG1, TG2, TG3 and TG4.

Figure 9:
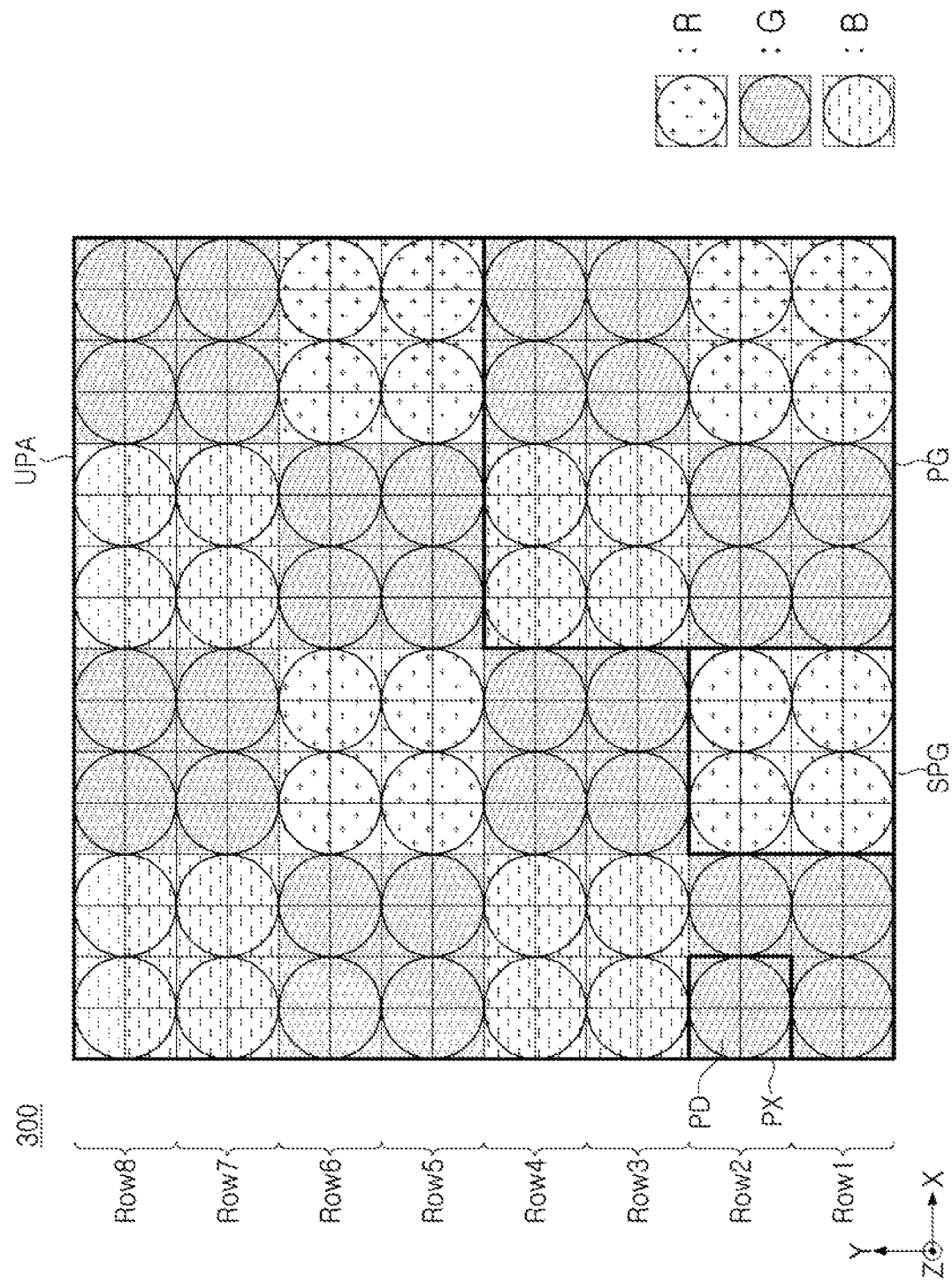
FIG. 9 is a plan diagram illustrating a pixel array included in an image sensor according to an embodiment.

FIG. 9 is a plan diagram illustrating a pixel array included in an image sensor according to an example embodiment.

FIG. 9 may be a diagram illustrating pixel groups PGs corresponding to arrangement of color filters included in the image sensor 300 and components thereof according to an example embodiment.

Referring to FIG. 9, arrangement of a color filter may correspond to four sub-pixel groups SPG, and each of the sub-pixel groups SPG may include a color filter having a predetermined color. Each of the sub-pixel groups SPG may include a plurality of unit pixels PX arranged in 2×2 form. In the image sensor 300 in an example embodiment, the color filter disposed on the sub-pixel groups SPG may have one of red R, green G, and blue B colors. For example, the pixel array of the image sensor 300 may include color filters repeatedly arranged in the order of blue, green, green, and red to correspond to the plurality of pixel groups PG arranged in 2×2 form.

In embodiments, the plurality of unit pixels PX included in each pixel group PG may be defined by a device isolation film disposed therebetween.

An autofocusing function may automatically bring a subject into focus using a pixel signal obtained from a plurality of unit pixels PX included in the image sensor 300, and an image may be generated using the obtained pixel signal. Specifically, the pixel signal output by the unit pixels PX may be converted into a digital signal by an analog-to-digital converter, and the digital signal may be used to automatically focus or generate an image.

Autofocusing pixels may perform an autofocusing operation by obtaining pixel signals from a plurality of photodiodes arranged in 2×2 form. For example, autofocusing information in the upward and downward directions may be obtained using pixel signals of photodiodes arranged in the upward and downward directions, and autofocusing information in the left and right directions may be obtained using pixel signals of photodiodes arranged in the left and right directions. Accordingly, the image sensor 300 may perform an autofocusing operation based on autofocusing information in multiple directions, that is, for example, the upward and downward directions and the left and right directions.

In an example embodiment, the image sensor 300 may perform an autofocusing function using pixel signals obtained from the photodiodes PD disposed in different positions in each of the plurality of unit pixels PX.

For example, each of the unit pixels PX included in the unit pixel array UPA may include a plurality of photodiodes PD. The photodiodes PD of each unit pixel PX may be divided to first to fourth photodiodes PD1-PD4 according to their relative positions in the second direction X and the third direction Y within the unit pixel. In each of the unit pixels PX in the unit pixel array UPA, a focus of the unit pixels PX in the unit pixel array UPA may be automatically adjusted using pixel signals obtained from one or more photodiodes evenly selected from among the first to fourth photodiodes PD1 to PD4 in each of the unit pixels PX in the unit pixel array UPA.

The image sensor 300 in FIG. 9 may include a unit pixel array UPA including 8 rows Row1-Row8 and 8 columns of unit pixels PX. FIG. 9 illustrates a single unit pixel array UPA included in the image sensor 300, but the image sensor 300 may include a plurality of unit pixel arrays UPA. Also, the number of rows and columns included in a single unit pixel array UPA is not limited to any particular example.

The plurality of unit pixels PX included in the image sensor 300 may be driven by a row unit. In an example embodiment, pixel signals may be simultaneously output from two or more rows, and the simultaneously output pixel signals may be used to automatically focus. The image sensor 300 may include a plurality of analog-to-digital converters to convert the simultaneously output pixel signals into digital signals.

Figure 10A:
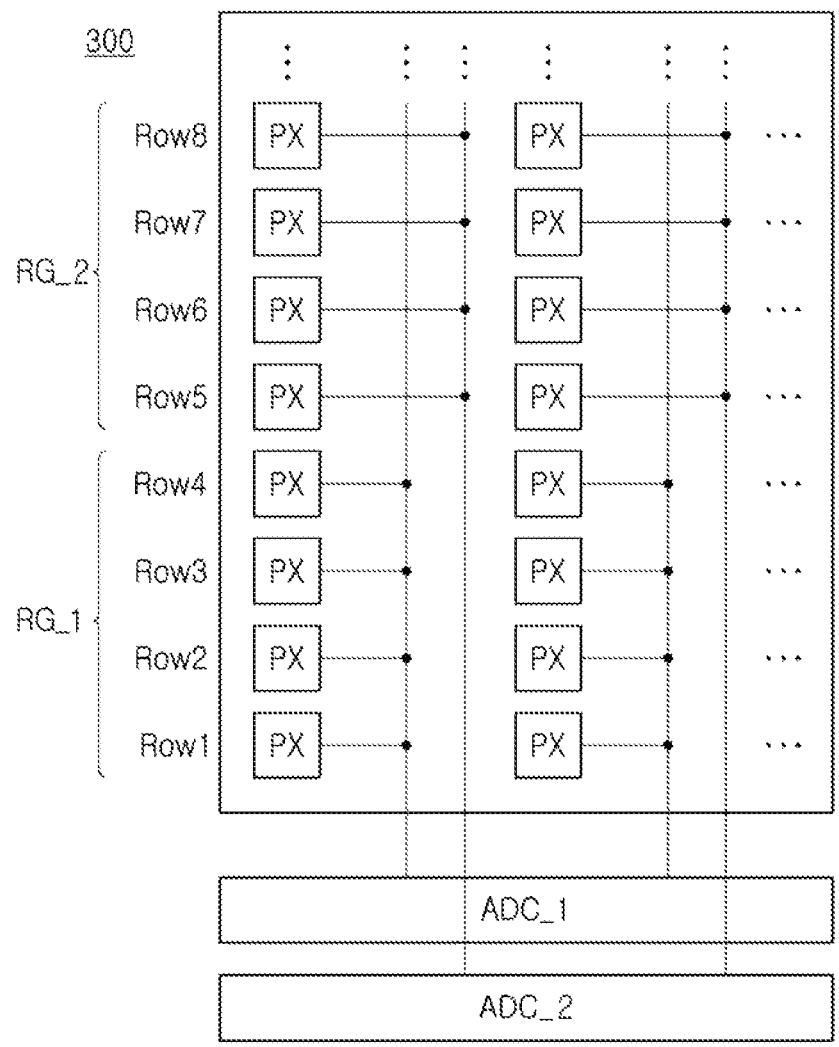
FIGS. 10A and 10B are diagrams illustrating an image sensor including a pixel array and a plurality of analog-to-digital converters for converting a pixel signal of the pixel array according to an embodiment.
Figure 10B:
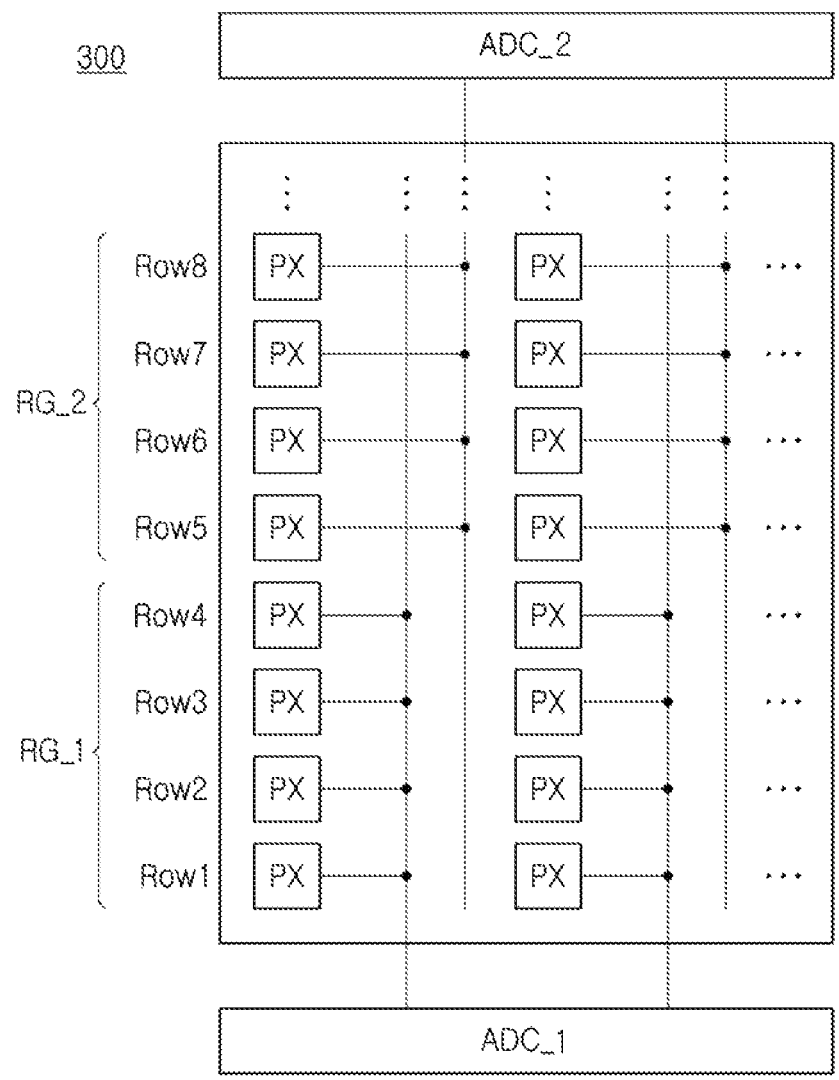

FIGS. 10A and 10B are diagrams illustrating an image sensor 300 including a pixel array and a plurality of analog-to-digital converters for converting a pixel signal of the pixel array in example embodiments. FIG. 10A illustrates an image sensor 300 including a pixel array including a plurality of unit pixels PX and a plurality of analog-to-digital converters ADC_1 and ADC_2. The pixel array illustrated in FIG. 10A may have substantially the same structure as that of the pixel array described with reference to FIG. 9.

The unit pixels PX included in the pixel array may be included in a plurality of rows Row1-Row8. The plurality of rows may be grouped into a first row group RG_1 and a second row group RG_2.

Rows Row1-Row4 included in the first row group RG_1 may be connected to the first analog-to-digital converter ADC_1 through column lines. Pixel signals output by the first row group RG_1 may be transmitted to the first analog-to-digital converter ADC_1, and the transmitted pixel signals may be converted into digital signals. Similarly, the rows Row5-Row8 included in the second row group RG_2 may be connected to the second analog-to-digital converter ADC_2 through column lines. Pixel signals transmitted from the odd-numbered row to the odd-numbered analog-to-digital converter ADC_2 may be converted into digital signals.

The first row group and the second row group may be connected to different analog-to-digital converters through different column lines. Accordingly, the pixel signals of the first row group and the pixel signal of the second row group may be simultaneously output, and a focus may be automatically adjusted using the simultaneously outputted pixel signals.

FIG. 10B illustrates an image sensor 300 including a pixel array including a plurality of unit pixels PX and a plurality of analog-to-digital converters ADC_1 and ADC_2. The pixel array in FIG. 10B may have the same structure as that of the pixel array in FIG. 10A, and may be connected to a plurality of analog-to-digital converters ADC_1 and ADC_2 in the same manner as in FIG. 10A. FIG. 10A illustrates all of the plurality of analog-to-digital converters ADC_1 and ADC_2 in FIG. 10A as being be disposed below the pixel array, whereas FIG. 10B illustrates an embodiment in which the second analog-to-digital converter ADC_2 may be disposed above the pixel array and the first analog-to-digital converter ADC_1 may be disposed below the pixel array.

Figure 11:
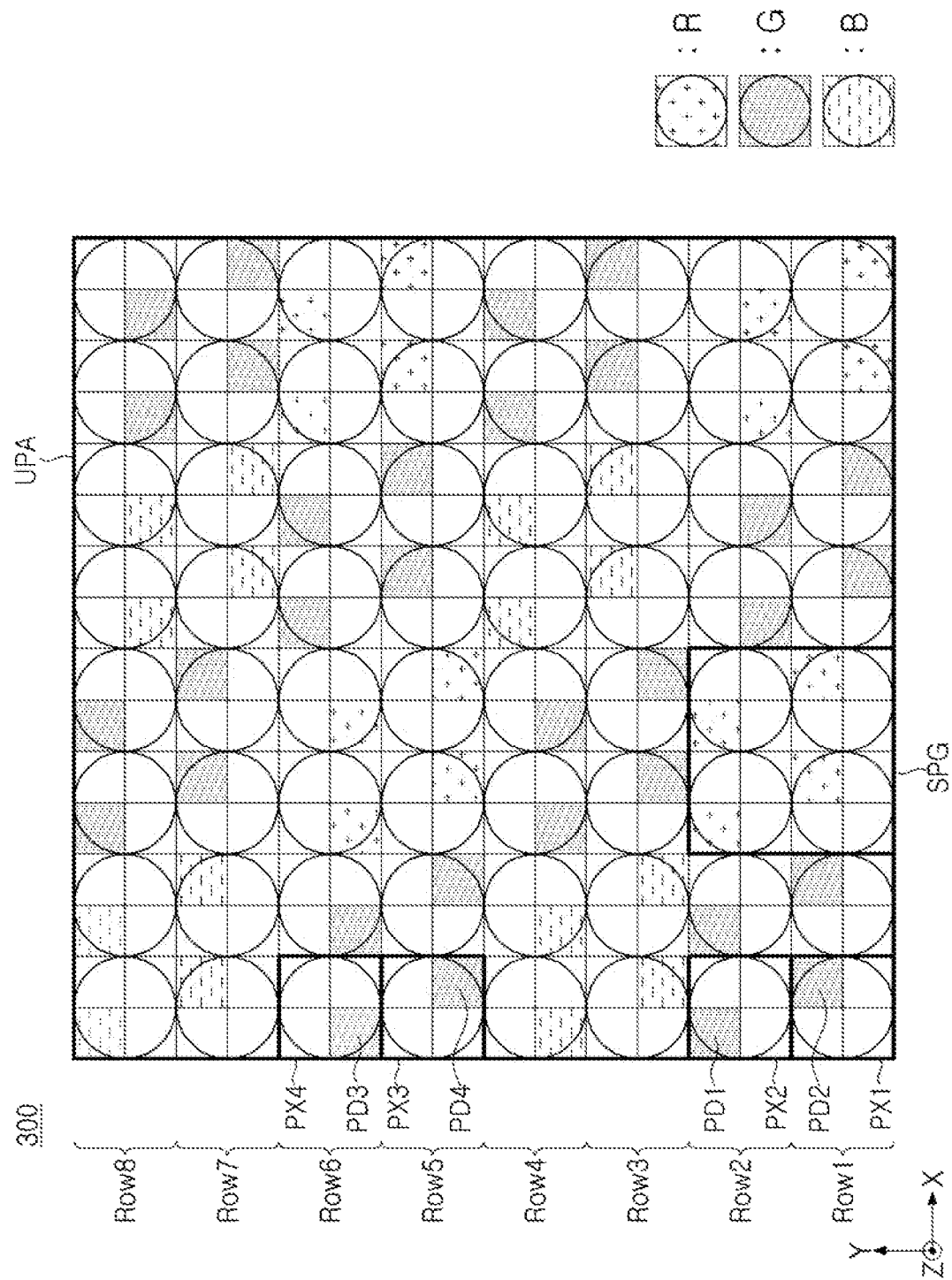
FIG. 11 is a cross-sectional diagram illustrating an autofocusing operation of an image sensor according to an embodiment.
Figure 12:
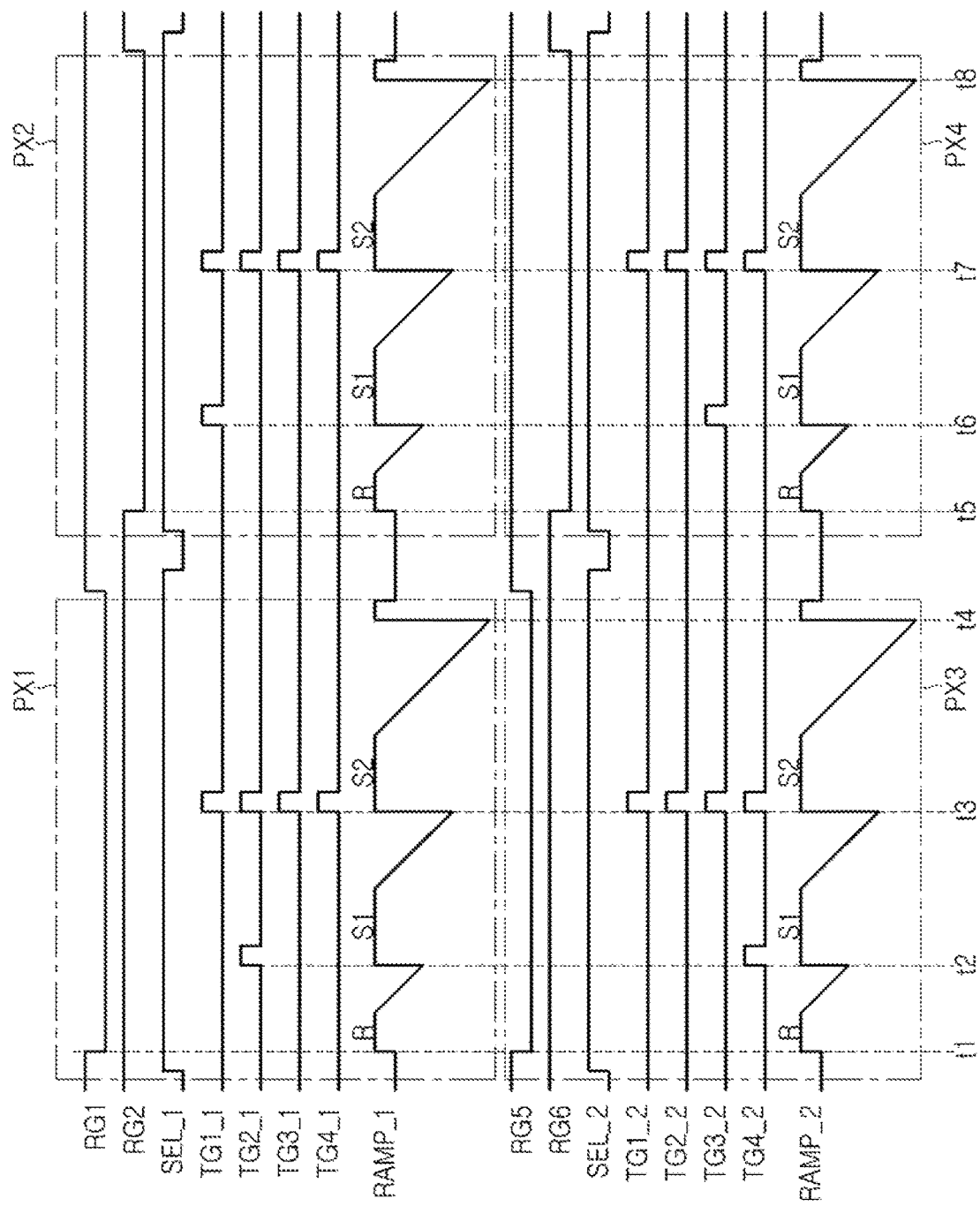
FIG. 12 is a waveform diagram illustrating an autofocusing operation of an image sensor according to an embodiment.

FIGS. 11 and 12 are diagrams illustrating an autofocusing operation of an image sensor according to an example embodiment. Specifically, FIG. 11 is a diagram illustrating a photodiode read during a first read operation S1 for an autofocusing operation of the image sensor. FIG. 12 is a waveform diagram illustrating an autofocusing operation of an image sensor according to an example embodiment.

Referring to FIG. 11, the image sensor 300 may include a plurality of unit pixels PX arranged in parallel in the second direction X and the third direction Y on an upper surface of the substrate. Each of the plurality of unit pixels PX may include a color filter and a microlens disposed on the color filter. Each of sub-pixel groups SPG including a plurality of unit pixels PX arranged in 2×2 form may include a color filter of the same color. In each of the plurality of unit pixels PX, the substrate may include a plurality of photodiodes divided in 2×2 form by an isolation film. The plurality of photodiodes may be divided into first to fourth photodiodes PD1-PD4 according to their relative positions in the second direction X and the third direction Y within the unit pixel PX. In the example in FIG. 11, a photodiode disposed on an upper left-side in the unit pixel PX may be configured as a first photodiode PD1, a photodiode disposed on an upper right-side may be configured as a second photodiode PD2, a photodiode disposed a lower left-side may be configured as a third photodiode PD3, and a photodiode disposed on a lower right-side may be configured as a fourth photodiode PD4. The image sensor 300 in an example embodiment may read out a reset signal, and may perform an autofocusing operation by operating in RS1S2 mode in which the pixel signal is read out twice. Accordingly, the image sensor 300 may reduce an increase in the number of operations of the analog-to-digital converter for performing the autofocusing operation, and may perform the autofocusing operation in multiple directions while reducing a decrease in frame rate.

For example, the logic circuit of the image sensor 300 may include a readout circuit configured to obtain a reset signal from each of the plurality of unit pixels PX, to obtain a single pixel signal from one of the photodiodes PD1, PD2, PD3, and PD4 included in each of the plurality of unit pixels PX, and to obtain a summed pixel signal of the photodiodes PD1, PD2, PD3, and PD4 from each of the plurality of unit pixels PX.

In this case, since the image sensor 300 may perform the autofocusing operation in multiple directions by reading out the pixel signal only twice, a photodiode for obtaining the single pixel signal by the first readout operation, that is, a first operation S1 in each of the plurality of unit pixels PX in the unit pixel array UPA may be evenly selected from among the plurality of photodiodes PD1, PD2, PD3, and PD4.

For example, the arrangement of the photodiodes on which the readout operation is performed may be determined to be repeated for each unit pixel array UPA arranged in an 8×8 form. Accordingly, an entirety of 64 unit pixels PX included in the unit pixel array UPA may include 16 unit pixels PX which may obtain a pixel signal from the first photodiode PD1, 16 unit pixels PX which may obtain a pixel signal from the second photodiode PD2, 16 unit pixels PX which may obtain a pixel signal from the third photodiode PD3, and 16 unit pixels PX which may obtain a pixel signal from the fourth photodiode PD4. However, embodiments are not limited thereto, and the arrangement of photodiodes on which the first read operation S1 is performed may be determined in various manners.

The readout circuit of the image sensor 300 in an example embodiment may perform an autofocusing operation in the upward and downward directions and the left and right directions based on the single pixel signal and the summed pixel signal. For example, the readout circuit may combine single pixel signals obtained from photodiodes in different positions in each of the first to fourth unit pixels PX1 to PX4 included in the unit pixel array UPA and may perform the autofocusing operation in the upward and downward directions and the upward and downward directions. A distance between the photodiodes in different positions may be configured to be, for example, only a few micrometers, such that, even when the single pixel signals from the photodiodes in different positions are combined, the autofocusing operation may be performed normally. The number of single pixel signals used for the autofocusing operation in the upward and downward directions may be the same as the number of single pixel signals used for the autofocusing operation in the left and right directions.

FIG. 12 may illustrate an autofocusing operation using first to fourth unit pixels PX1 to PX4 among the unit pixels PX illustrated in the image sensor 300 in FIG. 11. In FIG. 12, time points t1 to t8 and operations of R, S1, and S2 may be different from the time points and the operations illustrated in FIG. 5.

As described with reference to FIGS. 10A and 10B, the pixel signals in the first row group and the pixel signals in the second row group may be simultaneously output. Referring to FIG. 12, pixel signals may be simultaneously output by two unit pixels PX1 and PX3 connected to the first row Row1 and the fifth row Row5 in a period between t1 and t4. Thereafter, pixel signals may be simultaneously output by the two unit pixels PX2 and PX4 connected to the second row Row2 and the sixth row Row6 in a period between t5 and t8.

Referring to FIG. 12, in the image sensor 300, in a state in which the reset control signals RG1 and RG5 of the first row and the fifth row are activated, the reset transistor may be turned on, such that a voltage of the floating diffusion region may be reset by a power supply voltage.

In a time period between t1 and t2, the logic circuit may perform a reset operation R. The reset operation R may be defined as an operation of obtaining a reset signal of the reset floating diffusion region. When the transfer control signals TG1_1-TG4_1 and TG1_2-TG4_2 are deactivated and the reset control signals RG1 and RG5 are activated, the voltage of the floating diffusion region may be reset to the power supply voltage VDD. When the voltage of the floating diffusion region is reset, the select control signal SEL_1 may be activated to turn on the select transistor, and the reset control signal RG1 and RG5 may be deactivated to turn off the reset transistor, such that the readout circuit may obtain a set signal value according to the reset voltage of the pixel.

In a time period between t2 and t3, the logic circuit may perform a first read operation S1 of obtaining a pixel signal generated by one of photodiodes included in each unit pixel PX. During the first operation S1, the readout circuit may generate and store a single pixel signal according to electric charges of one photodiode disposed in the first position among the photodiodes PD1, PD2, PD3, and PD4.

For example, in the time period between t2 and t3, the logic circuit may activate the second transfer control signal TG2_1 applied to the second transfer transistor connected to the second photodiode PD2 of the first unit pixel PX1, thereby obtaining a single pixel signal from electric charges stored in the second photodiode PD2. Simultaneously, the logic circuit may activate the fourth transfer control signal TG4_2 applied to the fourth transfer transistor connected to the fourth photodiode PD4 of the third unit pixel PX3, thereby obtaining a single pixel signal from electric charges stored in the fourth photodiode PD4. However, embodiments are not limited thereto, and the pixel signal may be obtained from electric charges stored in two photodiodes other than the second and fourth photodiodes PD2 and PD4.

The single pixel signal corresponding to the second photodiode PD2 and the single pixel signal corresponding to the fourth photodiode PD4 may be used for the autofocusing operation. For example, the single pixel signals may be combined and used as a right-side signal for focusing the right and left sides of the unit pixel PX.

Referring to FIG. 11, in a time period between t3 and t4, the logic circuit may perform a second read operation S2 for obtaining a summed pixel signal. The logic circuit may obtain the summed pixel signal from each of the plurality of unit pixels PX arranged in one or more columns from the second read operation S2. For example, a summed pixel signal may be obtained from each of the unit pixels PX included in the first row Row1 along with the first unit pixel PX1 in the time period between t3 and t4, and simultaneously, the summed pixel signal may be obtained from each of the unit pixels PX included in the fifth row Row5 along with the third unit pixel PX3. The summed pixel signals may be used to generate an image.

An operation similar to the readout operation performed on the first and third unit pixels PX1 and PX3 in the time period between t1 and t4 may be performed on the second and fourth unit pixels PX2 and PX4 in the time period between t5 and t8.

For example, the reset operation R may be performed in a time period between t5 and t6. Thereafter, in a time period between t6 and t7, a first read operation S1 of obtaining a single pixel signal from electric charges stored in the first photodiode PD1 of the second unit pixel PX2 and obtaining a single pixel signal from electric charges stored in the third photodiode PD3 of the fourth unit pixel PX4 may be performed. The pixel signal corresponding to the first photodiode PD1 and the single pixel signal corresponding to the third photodiode PD3 may be used for autofocusing. For example, the pixel signals may be summed and used as a left-side signal for focusing right and left sides of the unit pixel PX.

In a time period between t7 and t8, a second read operation S2 of obtaining a summed pixel signal from each of the unit pixels PX included in the second row Row2 along with the second unit pixel PX2, and simultaneously obtaining a summed pixel signal from each of the unit pixels PX included in the sixth row Row6 along with the fourth unit pixel PX4 may be performed. The summed pixel signals obtained in the second read operation S2 may be used to generate an image. The reset signals, the single pixel signals and the summed pixel signals may correspond to decreases of ramp signals RAMP_1 and RAMP_2 in the time periods.

The image sensor 300 may combine the single pixel signals obtained based on the first read operation S1 performed on the four unit pixels PX1 to PX4 in the time period between t1 and t8 and may perform an autofocusing operation in the left and right directions and the upward and downward directions. For example, the image sensor 300 may automatically focus in the left and right direction using a left-side signal obtained by summing single pixel signals obtained from the first and third photodiodes PD1 and PD3, and a right-side signal obtained by summing single pixel signals obtained from the second and fourth photodiodes PD2 and PD4. Also, the image sensor 300 may automatically focus in the upward and downward directions using an upper-side signal obtained by summing single pixel signals obtained from the first and second photodiodes PD1 and PD2, and a single pixel obtained by summing single pixel signals obtained from the third and fourth photodiodes PD3 and PD4. As described with reference to FIG. 12, autofocusing operation may be performed based on a readout operation for the first to fourth unit pixels PX1 to PX4 included in the first, second, fifth, and sixth rows Row1, Row2, Row5, and Row6, as illustrated in FIG. 11. Because the unit pixels PX included in a single row may be read simultaneously, in the time period between t1 and t8, autofocusing operation of unit pixels included in the sixth row Row1, Row2, Row5, and Row6 may be performed along with the first to fourth unit pixels PX1 to PX4.

Similarly, an autofocusing operation may be performed based on a readout operation of the unit pixels PX included in the third, fourth, seventh, and eighth rows Row3, Row4, Row7, and Row8. The third row Row3 and the seventh row Row7 may be read out simultaneously, and the fourth row Row4 and the eighth row Row8 may be read out simultaneously.

In the autofocusing operation of the image sensor 300, the number of performing the readout operation may be reduced as compared to the autofocusing operation of the image sensor 200 illustrated in FIG. 5.

Specifically, in the image sensor 200 in FIG. 5, five readout operations (R and S1-S4) may be performed in each row to perform a reset operation, to perform an autofocusing operation, and to generate image data. In the image sensor 300, even when only three readout operations (R, S1 and S2) are performed in each row, the autofocusing operation may be performed by combining the results of the first read operations S1 between the rows, and image data may be generated based on results of the second read operation S2.

When the number of performing the readout operation required for the autofocusing operation in each row is reduced, the number of operations of the analog-to-digital converter may also be reduced. When the number of performing the readout operation and the number of operations of the analog-to-digital converter are reduced, a frame period may be shortened and the frame rate may improve. Also, power required to generate the same number of frames may be reduced.

However, in contrast to the image sensor 200 illustrated in FIG. 5 in which the autofocusing operation is performed for each unit pixel PX, in the image sensor 300 in the example embodiment shown for example in FIGS. 11-12, the autofocusing operation may be performed by four unit pixels PX, such that density of the autofocusing operation may be lowered to about ¼ of density of the autofocusing operation of the image sensor 200 illustrated in FIG. 5.

The image sensor 300 in an example embodiment may include an analog-to-digital converter configured to convert the pixel signals obtained from the plurality of photodiodes PD1, PD2, PD3, and PD4 into digital signals. The analog-to-digital converter may adjust the magnitude of an output signal according to the read signal.

For example, a magnitude of the output signal output by processing a single pixel signal obtained from one of the photodiodes in the first read operation S1 by the analog-to-digital converter may be smaller than a magnitude of an output signal output by processing a summed pixel signal obtained from the four photodiodes in the second read operation S2. For example, when the summed pixel signal is output as a 10-bit signal, a value of the individual pixel signal may also be expressed as an 8-bit signal.

In example embodiments, the analog-to-digital converter may output a single pixel signal as a 9-bit signal and may output the summed pixel signal as a 10-bit signal. In this case, compared to the example in which the analog-to-digital converter uniformly outputs the single pixel signal and the summed pixel signal as 10-bit signals, the time taken for the analog-to-digital converter to process the single pixel signal may be reduced. Accordingly, in the image sensor 300 in the example embodiment, the frame period may be further shortened, and the reduction in the frame rate may be alleviated.

Figure 13:
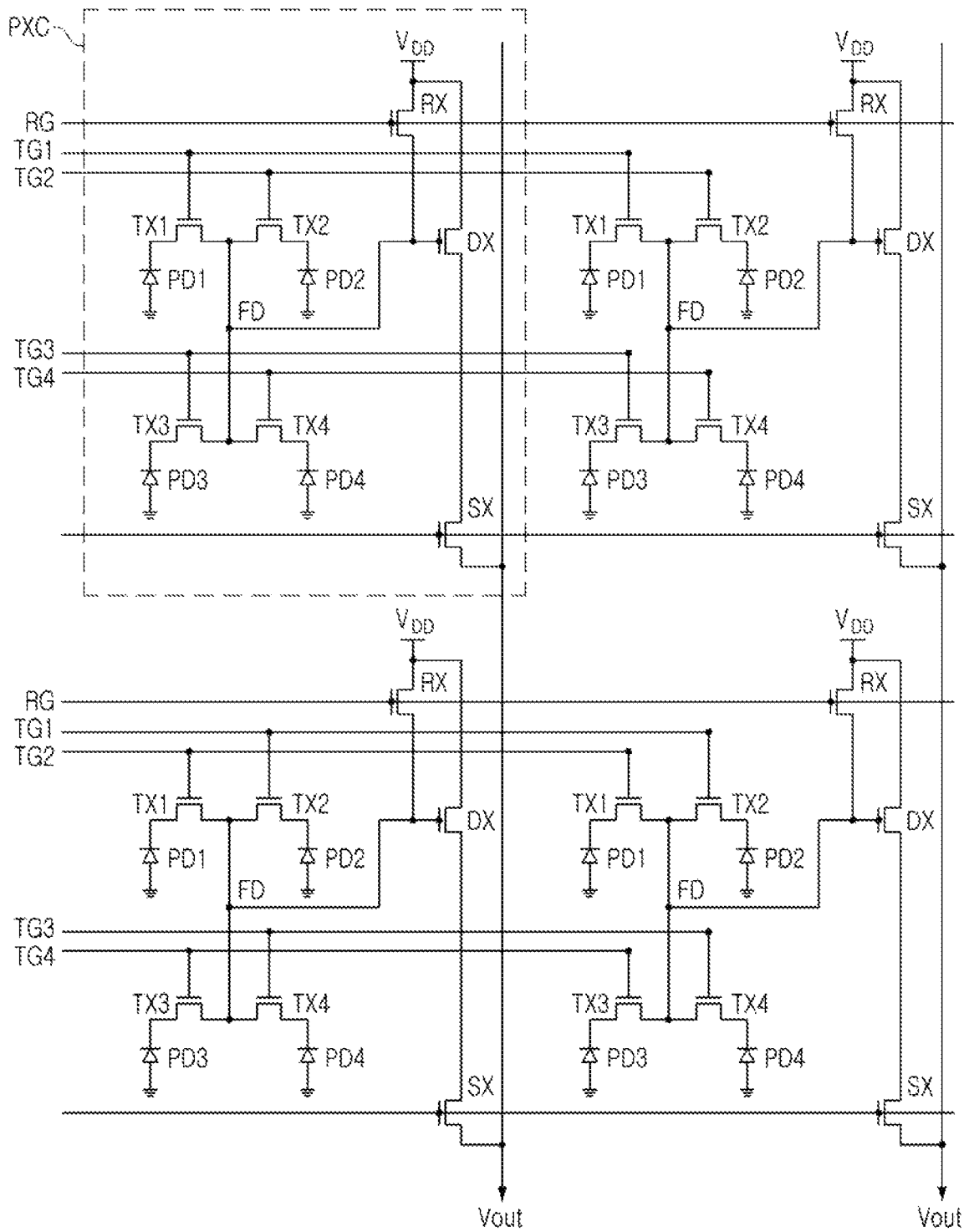
FIG. 13 is a circuit diagram illustrating a pixel circuit of an image sensor according to another embodiment.

FIG. 13 is a circuit diagram illustrating a pixel circuit of an image sensor according to another example embodiment.

The pixel circuit PXC in FIG. 13 may correspond to the pixel circuit PXC of the image sensor 100 in an example embodiment illustrated in FIG. 2. For example, the configuration of the pixel circuit PXC in FIG. 13 may be similar to that of the pixel circuit PXC in FIG. 2. A control signal may be applied to gate electrodes of a plurality of transistors included in the pixel circuit PXC, such as a transfer transistor, a reset transistor, a driver transistor, and a select transistor, through a plurality of metal wirings.

In the image sensor in an example embodiment, the readout circuit may select a photodiode for obtaining a pixel signal from each of the plurality of unit pixels PX based on the connection relationship between the plurality of metal wirings.

In FIGS. 2 and 13, the connection relationship between the transfer transistors TX1-TX4 included in the unit pixels PX and the metal wirings transmitting the transfer control signal may be configured differently. For example, referring to FIG. 2, the first to fourth transfer transistors TX1 to TX4 of the unit pixels PX may be controlled by the first to fourth transfer control signals TG1 to TG4, respectively. Accordingly, to obtain the pixel signal from the first photodiode PD1 in the pixel circuits illustrated on the upper side and the pixel signal from the second photodiode PD2 in the pixel circuits illustrated on the lower side in the diagram, the pixel circuits illustrated on the lower side may activate the first transfer control signal TG1, and the pixel circuits illustrated on the upper side may activate the second transfer control signal TG2.

Referring to FIG. 13, in the pixel circuits illustrated on the upper side, the first transfer transistors TX1 may be controlled by the first transfer control signal TG1, and in the pixel circuits illustrated on the lower side, the second transfer transistors TX2 may be controlled by the first transfer control signal TG1. Accordingly, even when the first transfer control signal TG1 is applied collectively to the pixel circuits illustrated in FIG. 13, the pixel circuits illustrated on the upper side may obtain the pixel signal from the first photodiode PD1 and the pixel circuits illustrated on the lower side may obtain the pixel signal from the second photodiode PD2.

In FIG. 13, a connection relationship between the transfer transistors TX1-TX4 and the metal wirings transmitting the transfer control signal may be configured differently for each pixel circuit PXC. Accordingly, by applying one type of transfer control signal TG1 to each pixel circuit, a pixel signal may be obtained from a photodiode evenly selected from among each of the first to fourth photodiodes PD1-PD4 from each unit pixel. A method of connecting a metal wiring to obtain a pixel signal from one of the first to fourth photodiodes PD1-PD4 evenly selected may not be limited to the method described with reference to FIGS. 2 and 13. For example, in each pixel circuit, a metal line may be additionally connected to a photodiode uniformly selected from among each of the first to fourth photodiodes PD1-PD4, and a transfer control signal may be applied to the additional metal line, thereby obtaining a pixel signal from each pixel circuit, and an autofocusing operation may be performed using the obtained pixel signal.

Figure 14:
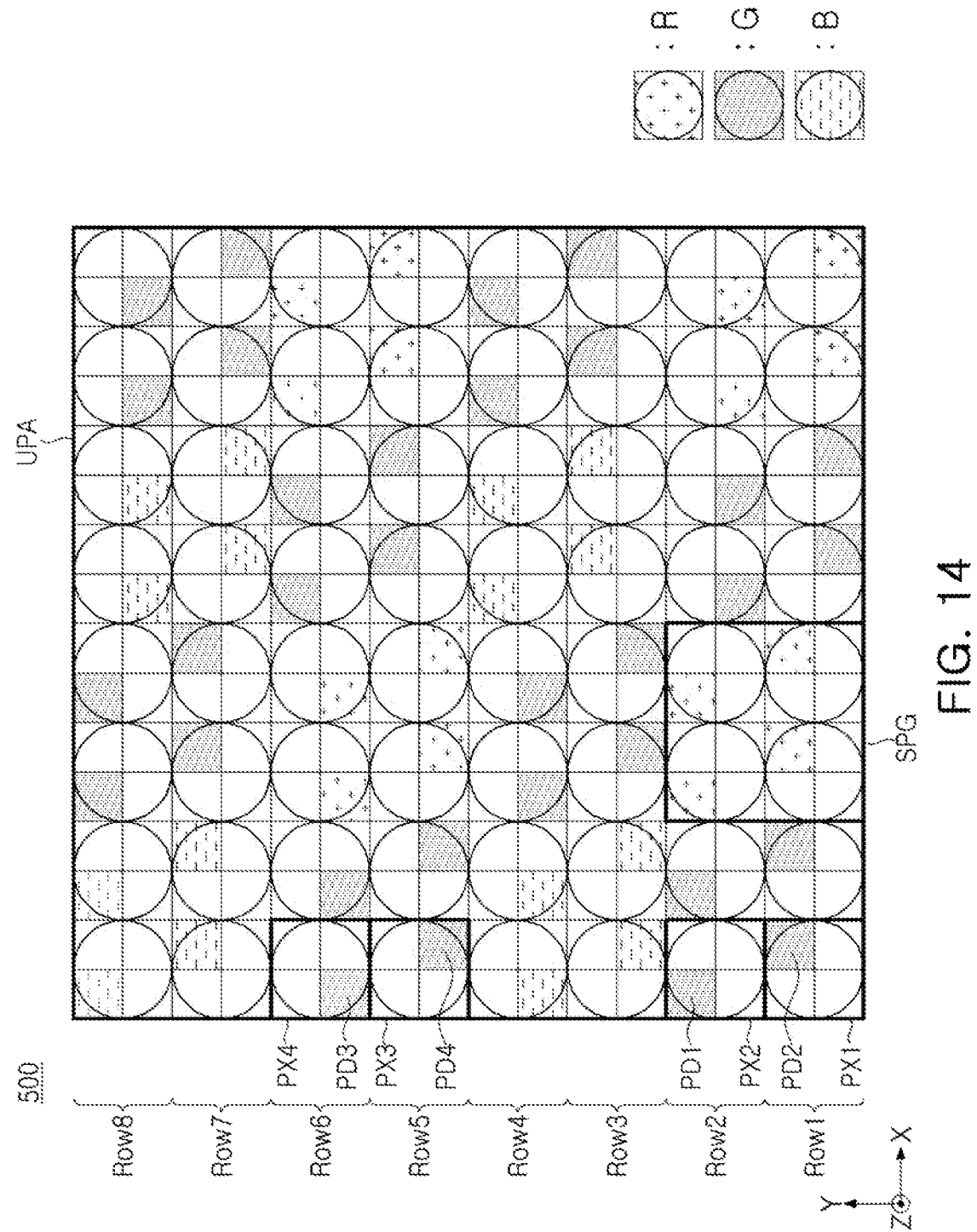
FIGS. 14 and 15 are plan diagrams illustrating an autofocusing operation of an image sensor according to an embodiment.
Figure 15:
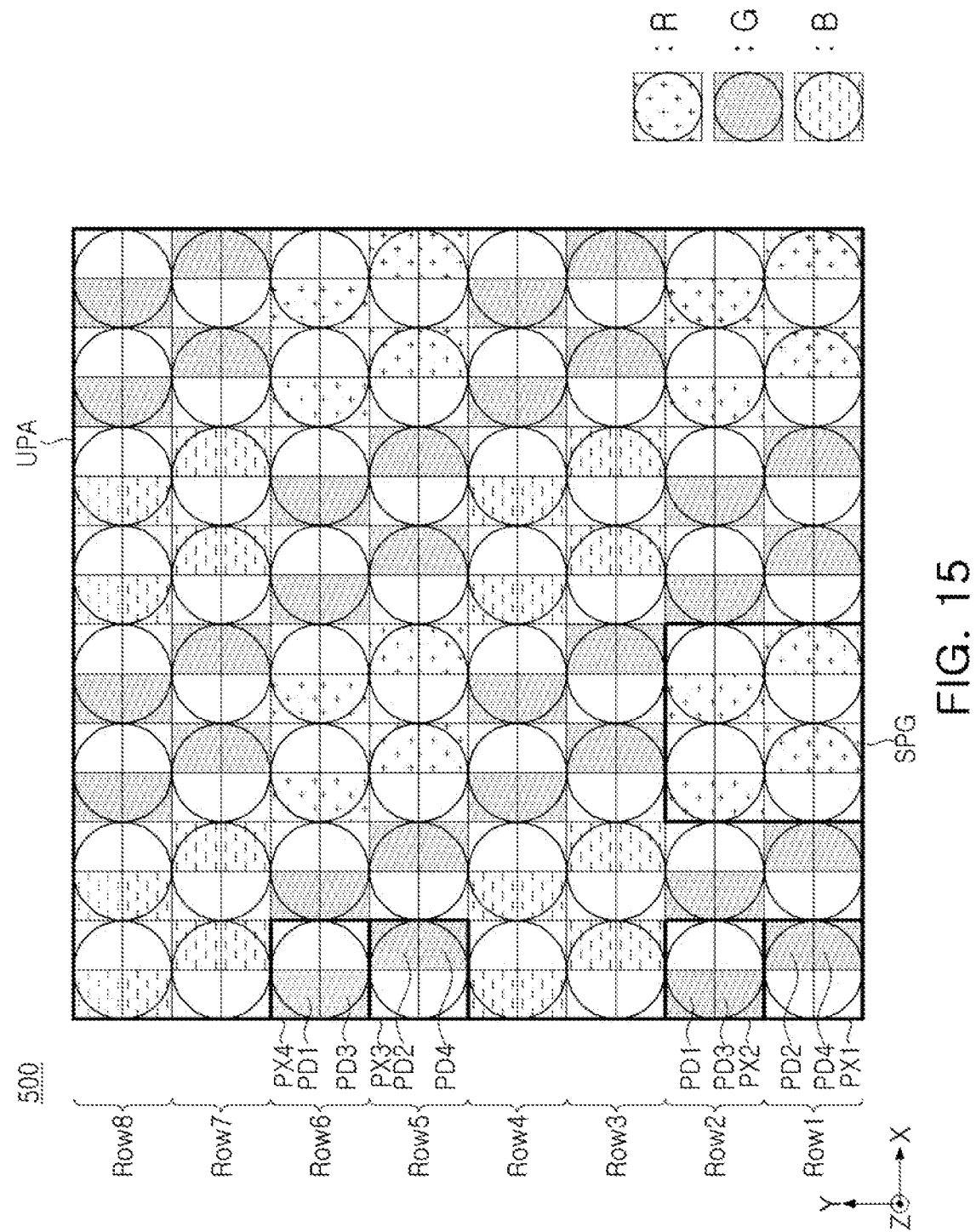
Figure 16:
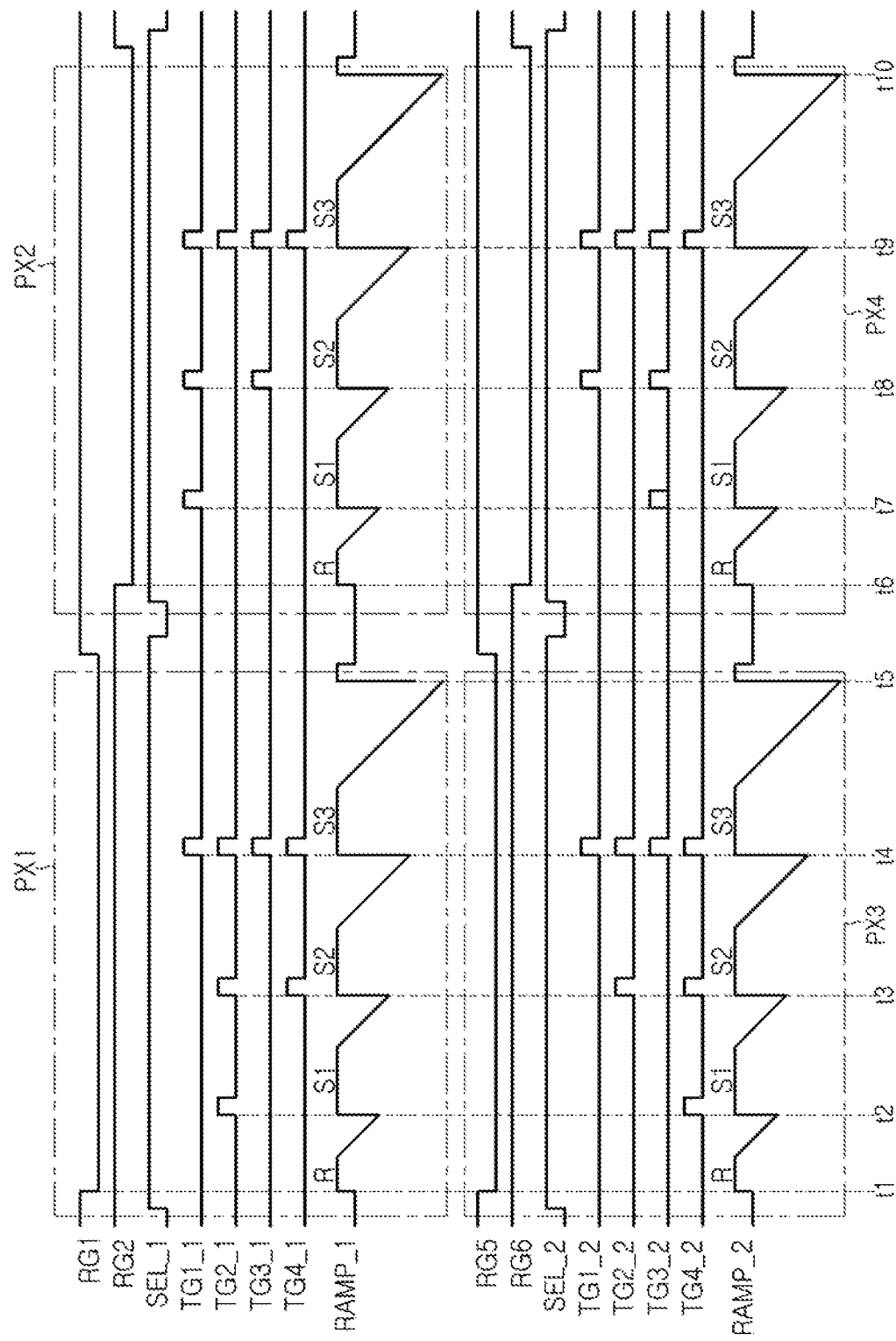
FIG. 16 is a waveform diagram illustrating an autofocusing operation of an image sensor according to an embodiment.
Figure 17:
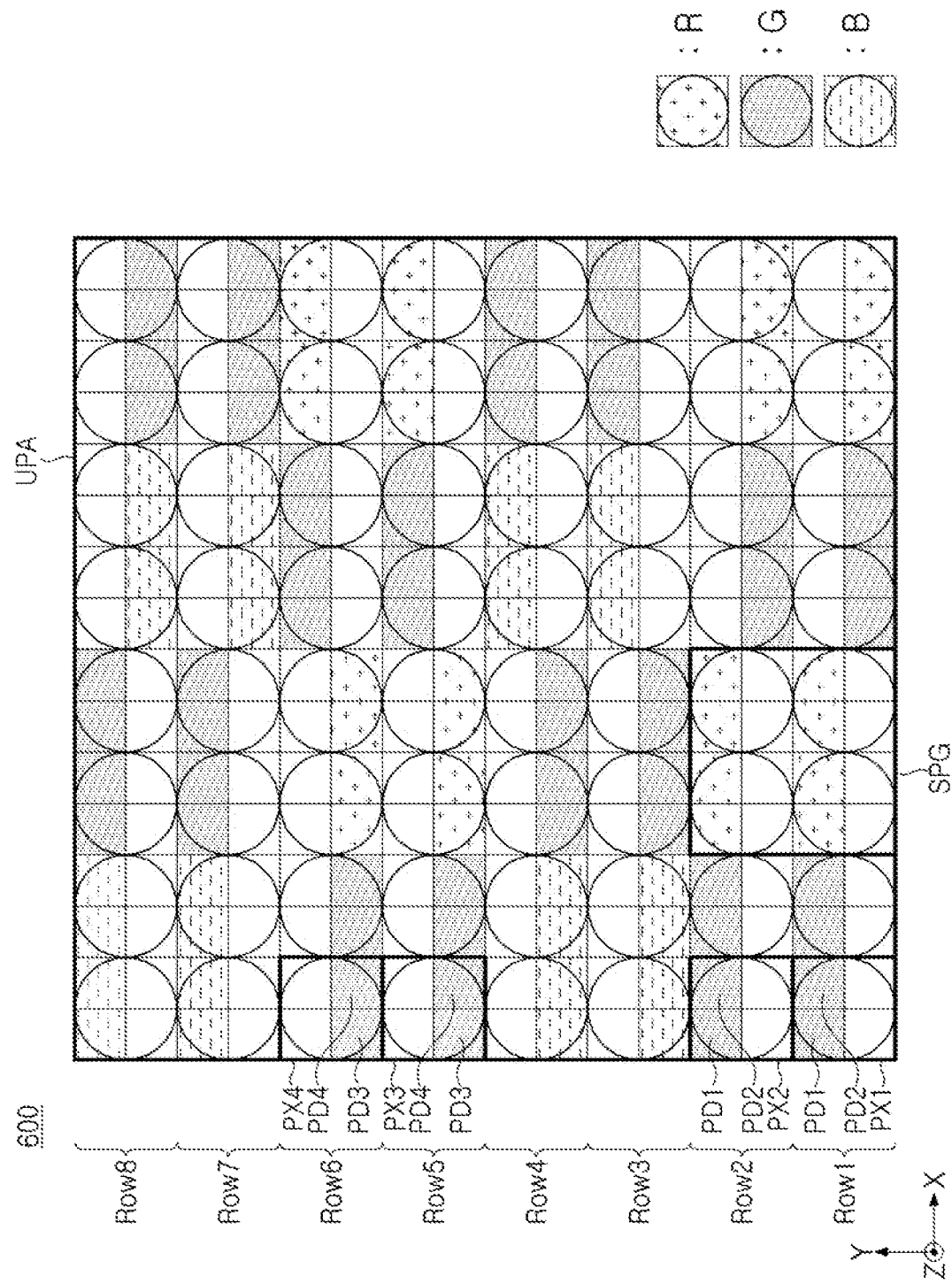
FIG. 17 is a plan diagram illustrating an autofocusing operation of an image sensor according to an embodiment.

FIGS. 14 and 15 are plan diagrams illustrating an autofocusing operation of an image sensor according to an example embodiment. FIG. 16 is a waveform diagram illustrating an autofocusing operation of an image sensor according to an example embodiment. FIG. 17 is a plan diagram illustrating an autofocusing operation of an image sensor according to an example embodiment.

Referring to FIGS. 14 and 15, an image sensor 500 may include a plurality of unit pixels PXs arranged in parallel in the second direction (e.g., X direction) and third direction (e.g., Y direction) on an upper surface of the substrate. Each of the plurality of unit pixels PX may include a color filter and a microlens disposed on the color filter. Each sub-pixel group SPG including the plurality of unit pixels PX arranged in 2×2 form may include a color filter of the same color. In each of the plurality of unit pixels PX, the substrate may include a plurality of photodiodes PD1, PD2, PD3, and PD4 divided in 2×2 form by an isolation film.

The image sensor 500 in an example embodiment may read out a reset signal, and may perform an autofocusing operation by operating in RS1S2S3 mode in which a pixel signal is read out three times. Accordingly, the image sensor 500 may have a reduced frame rate as compared to the image sensor 300 illustrated in FIG. 11, but density of the autofocusing operation may improve.

As an example, the logic circuit of the image sensor 500 may include a readout circuit configured to obtain a reset signal from each of the plurality of unit pixels PX, to obtain a single pixel signal from one of the photodiodes PD1, PD2, PD3, and PD4 included in each of the plurality of unit pixels PX during the first read operation S1 period, to obtain a dual pixel signal from two photodiodes adjacent to each other among the plurality of photodiodes PD1, PD2, PD3, and PD4 included in the plurality of unit pixels PX, and to obtain a summed pixel signal of entirety of the photodiodes PD1, PD2, PD3, and PD4 in the plurality of unit pixels PX during the third read operation S3 period. One of the two photodiodes read in the second operation S2 may include the photodiode read in the first read operation S1.

The operation of obtaining the single pixel signal in the first read operation S1 period in the image sensor 500 may be the same as the operation of obtaining the single pixel signal from the image sensor 300 illustrated in FIG. 11. That is, the arrangement of the photodiodes from which the single pixel signal illustrated in FIG. 14 is read may be the same as the example illustrated in FIG. 11. The photodiodes read in the second read operation S2 may include photodiodes read in the first read operation S1.

In the image sensor 500, the photodiodes for obtaining the dual pixel signal among the plurality of photodiodes PD1, PD2, PD3, and PD4 may be disposed in different positions in each of the plurality of unit pixels PX.

Referring to FIG. 15, in the second read operation S2 period, the unit pixels PX included in the sub-pixel group SPG of the image sensor 500 may obtain a dual pixel signal from the and the third photodiode PD3 or the second photodiode PD2 and the fourth photodiode PD4. Accordingly, the image sensor 500 may improve autofocusing performance in the left and right directions. For example, in the second operation S2 period, a right-side signal may be obtained from the second and fourth photodiodes PD2 and PD4 of the first unit pixel PX1. In the third operation S3 period, a summed pixel signal of the first unit pixel PX1 may be obtained. When the summed pixel signal and the right-side signal are subtracted, the left-side signal of the first unit pixel PX1 may be obtained. Since both the left-side signal and the right-side signal may be obtained for each unit pixel, an autofocusing operation in the left and right directions may be performed for each unit pixel. Accordingly, density of the autofocusing operation in the left and right directions may improve.

However, embodiments are not limited thereto, and photodiodes may be selected to improve density of the autofocusing operation in the upward and downward directions in the second read operation S2 period. Referring to FIG. 17, the unit pixels PX included in the sub-pixel group SPG of the image sensor 600 may obtain a second pixel signal from the first photodiode PD1 and the second photodiode PD2, or the third photodiode PD3 and the fourth photodiode PD4. Accordingly, the image sensor 500 may improve autofocusing performance in the upward and downward directions. For example, an upper-side signal may be obtained from the first and second photodiodes PD1 and PD2 of the first unit pixel PX1 in the second read operation S2 period, and in the third read operation S3 period, a summed pixel signal of the first unit pixel PX1 may be obtained. The lower-side signal of the first unit pixel PX1 may be obtained by subtracting the summed pixel signal and the upper-side signal. Since both the upper-side signal and the lower-side signal may be obtained for each unit pixel, an autofocusing operation in the upward and downward directions may be performed for each unit pixel. Accordingly, density of the autofocusing operation in the upward and downward directions may improve.

FIG. 16 may illustrate an autofocusing operation using the first to fourth unit pixels PX1 to PX4 among the unit pixels PX illustrated in the image sensor 500 in FIGS. 14 and 15. In FIG. 16, time points t1 to t10 and operations of R, S1, S2, and S3 may be distinguished from the time points and the operations illustrated in FIGS. 5 and/or 12.

As described with reference to FIGS. 10A and 10B, the pixel signals in the first row group and the pixel signals in the second row group may be simultaneously output. Referring to FIG. 16, pixel signals may be simultaneously output by two unit pixels PX1 and PX3 connected to the first row Row1 and the fifth row Row5 in a time period between t1 and t5. Also, pixel signals may be simultaneously output by the two unit pixels PX2 and PX4 connected to the second row Row2 and the sixth row Row6 in a time period between t6 and t10.

Referring to FIG. 16, in the image sensor 500, while the reset control signals RG1 and RG5 of the first row and the fifth row are activated, the reset transistor may be turned on, such that a voltage of the floating diffusion region may be reset by a power supply voltage. For example, in a time period between t1 and t2, the logic circuit may obtain a reset signal of the reset floating diffusion region by performing a reset operation R.

In a time period between t2 and t3, the logic circuit may obtain a single pixel signal generated by one of photodiodes included in each unit pixel PX by performing a first read operation S1. During the first operation S1, a first pixel signal according to a photodiode disposed in a first position among the photodiodes PD1, PD2, PD3, and PD4 may be stored. For example, in a time period between t2 and t3, the logic circuit may obtain a single pixel signal from the second photodiode PD2 by activating the second transfer control signal TG2_E of the first unit pixel PX1, and may obtain a single pixel signal from the fourth photodiode PD4 by activating the fourth transfer control signal TG4_2 of the third unit pixel PX3.

In a time period between t3 and t4, the logic circuit may obtain a dual pixel signal generated by two photodiodes among the photodiodes included in each unit pixel PX by performing a second operation S2. For example, in the time period between t3 and t4, the logic circuit may obtain a dual pixel signal from the second and fourth photodiodes PD2 and PD4 by activating the second and fourth transfer control signals TG2_1 and TG4_1 of the first unit pixel PX1. Simultaneously, the logic circuit may obtain the dual pixel signal from the second and fourth photodiodes PD2 and PD4 by activating the second and fourth transfer control signals TG2_2 and TG4_2 of the third unit pixel PX3. The second pixel signals obtained from the first and third unit pixels PX1 and PX3 in the time period between t3 and t4 may be configured as right-side signals of the first and third unit pixels PX1 and PX3.

In a time period between t4 and t5, the logic circuit may obtain a summed pixel signal from each of the plurality of unit pixels PX by perform a third operation S3. For example, in a time period between t4 and t5, the logic circuit may obtain summed pixel signals of the first and third unit pixels PX1 and PX3. The summed pixel signals may be used to generate image data and may also be used for autofocusing operation.

Specifically, left-side signals may be obtained by subtracting the right-side signals obtained in the time period between t3 and t4 from the summed pixel signals obtained in the time period between t4 and t5. An autofocusing operation in the left and right direction may be performed using the right-side signals and the left-side signals.

An operation similar to the readout operation performed on the first and third unit pixels PX1 and PX3 in the time period between t1 and t5 may be performed on the second and fourth unit pixels PX2 and PX4 in the time period between t6 and t10.

A reset operation R may be performed in a time period between t6 and t7. Thereafter, in the time period between t7 and t8, a first operation S1 of obtaining a single pixel signal from the signal stored in the first photodiode PD1 of the second unit pixel PX2 and obtaining a single pixel signal from electric charges stored in the third photodiode PD3 of the fourth unit pixel PX4 may be performed.

The single pixel signals obtained from the second and fourth photodiodes PD2 and PD4 in the time period between t2 and t3, and single pixel signals obtained from the first and third photodiodes PD1 and PD3 in the time period between t6 and t7 may be used for autofocusing. For example, an upper-side signal may be generated by summing a first pixel signal obtained from the first photodiode PD1 and a single pixel signal obtained from the second photodiode PD2. Also, a lower-side signal may be generated by summing the single pixel signal obtained from the third photodiode PD3 and the single pixel signal obtained from the fourth photodiode PD4. The upper-side signal and lower-side signal may be used as signals for focusing in the upward and downward directions in the unit pixel PX.

In a time period between t8 and t9, a second operation S2 of obtaining a dual pixel signal from the first and third photodiodes PD1 and PD3 of the second unit pixel PX2 and obtaining a duel pixel signal from the first and third photodiodes PD1 and PD3 of the fourth unit pixel PX4 may be performed. The dual pixel signals obtained from the second and fourth unit pixels PX2 and PX4 in the time period between t8 and t9 may configured as left-side signals of the second and fourth unit pixels PX2 and PX4.

In a time period between t9 and t10, the logic circuit may obtain summed pixel signals of the second and fourth unit pixels PX2 and PX4 by perform a third read operation S3. The summed pixel signals may be used to generate image data and may also be used for an autofocusing operation. The reset signals, the single pixel signals, the dual pixel signals and the summed pixel signals may correspond to decreases of ramp signals RAMP_1 and RAMP_2 in the time periods.

For example, the right-side signals of the second and fourth unit pixels PX2 and PX4 may be obtained by subtracting the left-side signals obtained in the time period between t8 and t9 from the summed pixel signals obtained in the time period between t9 and t10. An autofocusing operation in the left and right direction may be performed using the left and right-side signals.

Thereafter, the upper-side signal of the first and second unit pixels PX1 and PX2 may be obtained by summing the single pixel signals obtained from the second photodiode PD2 of the first unit pixel PX1 and the first photodiode PD1 of the second unit pixel PX2, and the lower-side signal of the first and second unit pixels PX1 and PX2 may be obtained by subtracting the upper-side signal from one of the summed pixel signals. An autofocusing operation in the upward and downward directions may be performed using the upper-side and lower-side signals.

The image sensor 500 in an example embodiment may obtain autofocusing information in multiple directions based on pixel signals obtained by readout operations in RS1S2S3 mode. The autofocusing operation of the image sensor 500 may increase the number of the readout operation performed as compared to the autofocusing operation of the image sensor 300 illustrated in FIG. 11, but may improve density of the autofocusing operation.

The readout circuit of the image sensors 500 and 600 in an example embodiment may perform autofocusing operations in upward and downward directions and left and right directions based on a single pixel signal, a dual pixel signal, and a summed pixel signal. In this case, the number of pixel signals used for the autofocusing operation in the upward and downward directions may be different from the number of pixel signals used for the autofocusing operation in the left and right directions.

For example, when the photodiodes for obtaining a dual pixel signal are adjacent to each other in the upward and downward directions as in the image sensor 600 in FIG. 17, the number of pixel signals used for the autofocusing operation in the left and right directions may be half of the number of pixel signals used for the autofocusing operation in the upward and downward directions. In this case, the density of the autofocusing operation in the upward and downward directions may be the same as the density of the autofocusing operation in the image sensor 200 illustrated in FIG. 5, and the density of the autofocusing operation in the left and right direction may be half the density of the autofocusing operation in the image sensor 200. This is because, when the photodiodes for obtaining the dual pixel signal are adjacent to each other in the upward and downward directions, the upper-side signal and the lower-side signal may be obtained for each individual unit pixel PX through the second and third read operations S2 and S3, whereas the left-side signal and the right-side signal may be obtained by combining the results of the first to third read operations S1, S2, and S3 of two unit pixels, such as, for example, the first and third unit pixels PX1 and PX3.

When the photodiodes for obtaining a dual pixel signal are adjacent to each other in the left and right directions as in the image sensor 500 in FIG. 15, the number of pixel signals used for the autofocusing operation in the upward and downward directions may be half the number of pixel signals used for the autofocusing operation in the left and right directions. In this case, the density of the autofocusing operation in the left and right directions may be the same as the density of the autofocusing operation in the image sensor 200 illustrated in FIG. 5, and the density of the autofocusing operation in the upward and downward directions may be half the density of the autofocusing operation in the image sensor 200.

In the image sensors 500 and 600 in an example embodiment, the readout circuit may include an analog-to-digital converter configured to convert the pixel signal obtained from the plurality of photodiodes PD1, PD2, PD3, and PD4 into a digital signal. The analog-to-digital converter may adjust the magnitude of the output signal according to the read signal.

The magnitude of the output signal output by processing the single pixel signal and/or the dual pixel signal by the analog-to-digital converter may be smaller than the magnitude of the output signal output by processing the summed pixel signal. For example, the magnitude of the output signal output by processing the single pixel signal and/or the dual pixel signal may be configured as 9 bits, and the magnitude of the output signal output by processing the summed pixel signal may be configured as 10 bits.

Accordingly, the time taken for the analog-to-digital converter to process the pixel signal obtained from one photodiode may be less than the time taken for the analog-to-digital converter to process the summed pixel signal obtained from entirety of the photodiodes. The image sensors 500 and 600 in an example embodiment may reduce the reduction in frame rate using the analog-to-digital converter configured as above.

The RS1S2S3 mode illustrated in FIG. 16 and the RS1S2 mode illustrated in FIG. 11 may differ in the presence or absence of an operation of obtaining a second pixel signal from two photodiodes adjacent to each other. The RS1S2S3 mode may have autofocusing density higher than that of the RS1S2 mode, and the RS1S2 mode may have a frame rate higher than that of the RS1S2S3 mode.

The image sensor 500 in an example embodiment may selectively perform an operation of obtaining the second pixel signal if desired. For example, the RS1S2 mode may be selected to obtain an image having a relatively high frame rate. When a high frame rate is not required, however, the RS1S2S3 mode may be selected to improve autofocusing performance with respect to an image.

Figure 18:
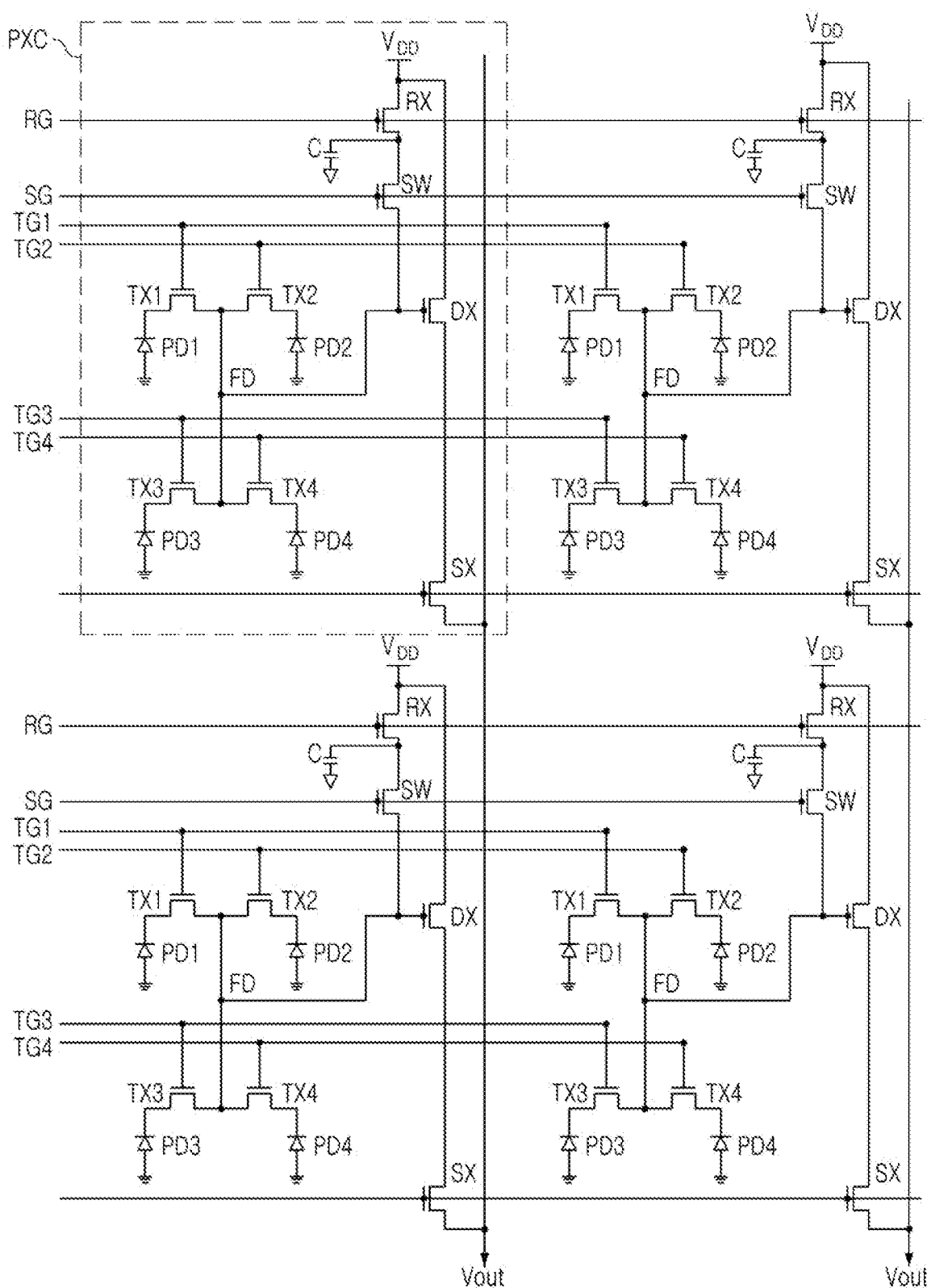
FIG. 18 is a circuit diagram illustrating a pixel circuit of an image sensor according to another embodiment.
Figure 19:
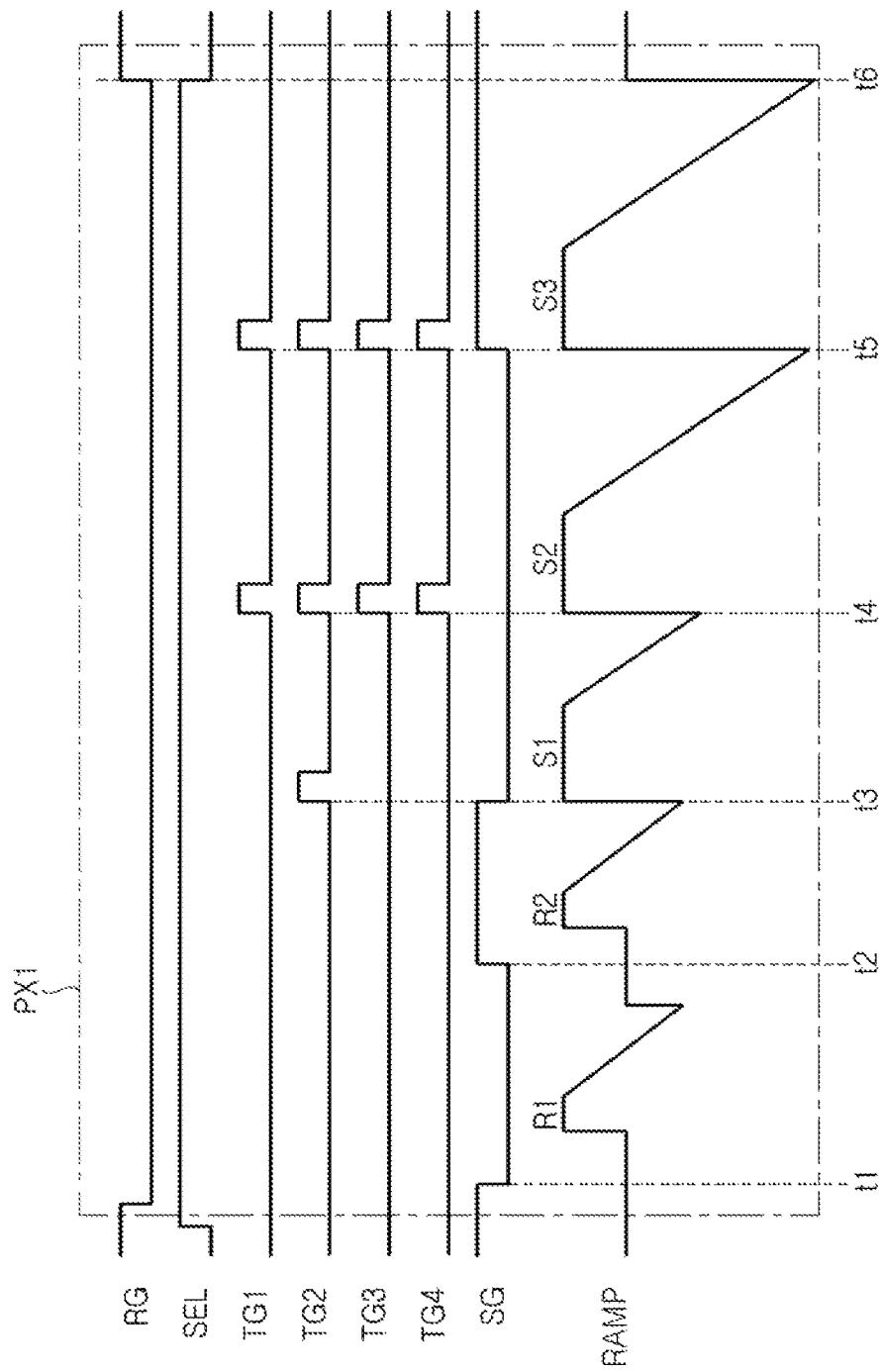
FIGS. 19 and 20 are waveform diagrams illustrating an autofocusing operation of an image sensor according to an embodiment.
Figure 20:
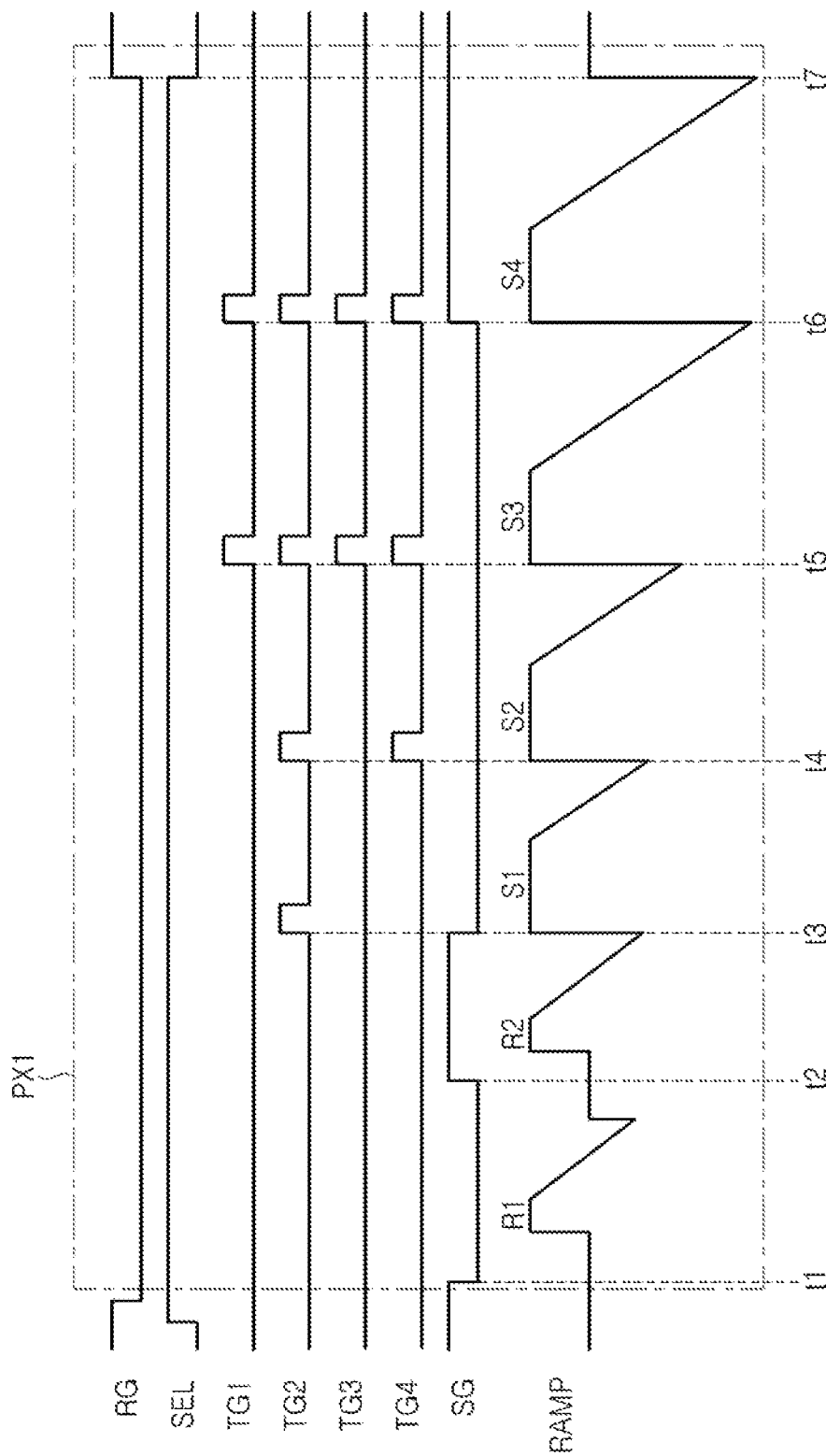

FIG. 18 is a circuit diagram illustrating a pixel circuit of an image sensor according to another example embodiment. FIGS. 19 and 20 are waveform diagrams illustrating an autofocusing operation of an image sensor according to an example embodiment.

The pixel circuit PXC in FIG. 18 may correspond to the pixel circuit PXC of the image sensor 100 in an example embodiment illustrated in FIG. 2. However, the pixel circuit PXC illustrated in FIG. 18 may further include an additional capacitor C for adjusting capacitance of the floating diffusion region FD. A switch device SW for controlling connection of the additional capacitor C may be further connected between the reset transistor RX and the floating diffusion region FD, and a dual conversion gain (DCG) function may be performed using the additional capacitor C.

A dynamic range may be increased by changing a conversion gain according to brightness around the image sensor using the dual conversion gain (DCG) function. The image sensor in an example embodiment may use the DCG function in the RSS mode, which may correspond to the RS1S2 mode discussed above, or the RSSS mode, which may correspond to the RS1S2S3 mode discussed above.

For example, the logic circuit of the image sensor may perform a readout operation on the plurality of unit pixels in the first mode when the floating diffusion region FD of each of the plurality of unit pixels PX has a first capacitance. In the first mode, the switch device SW may be in a turned-off state. The logic circuit may perform a readout operation on the plurality of unit pixels in the second mode when the floating diffusion region FD has a second capacitance greater than the first capacitance. In the second mode, the switch device SW may be in a turned-on state, and the second capacitance may be greater than the first capacitance by capacitance of the additional capacitor C. The pixel signal read out in the first mode may have a relatively high conversion gain (HCG), and the pixel signal read out in the second mode may have a relatively low conversion gain (LCG).

Referring to FIG. 19, the image sensor in an example embodiment may operate in R1R2S1S2S3 mode by using a DCG function.

The logic circuit may start the autofocusing operation by obtaining the reset signals R1 and R2 in the first mode and the second mode in sequence. For example, in the time period between t1 and t2, the switch control signal SG may be deactivated, and accordingly, the logic circuit may perform the first reset operation R1 for obtaining the reset signal in the first mode. When the switch control signal SG is activated in the time period between t2 and t3, the logic circuit may perform a second reset operation R2 in which the reset signal is obtained again in the second mode.

When the switch control signal SG is deactivated again in the time period between t3 and t4, the logic circuit may perform a first read operation S1 of obtaining a first pixel signal from one of the plurality of photodiodes included in each of the plurality of unit pixels PX in the first mode A. For example, a single pixel signal may be obtained from the second photodiode PD2 of the first unit pixel PX1 in a time period between t3 and t4.

Similarly to the example described with reference to FIG. 12, the single pixel signal obtained from the first read operation S1 may be used as a signal for the autofocusing operation. Although not illustrated in FIG. 19, as described with reference to FIG. 12, the single pixel signal may be obtained from the second photodiode PD2 of the first unit pixel PX1 and a single pixel signal may be obtained from the fourth photodiode PD4 of the third pixel PX3 simultaneously. The single pixel signals obtained from the second and fourth photodiodes PD2 and PD4 may be summed and may be used as a right-side signal for an autofocusing operation.

In embodiments, as described in FIG. 12, after the first and third unit pixels PX1 and PX3 are read out, the second and fourth unit pixels PX2 and PX4 may be read out. A single pixel signal may be generated by the first photodiode PD1 of the second unit pixel PX2 and a single pixel signal may be generated by the third photodiode PD3 of the fourth unit pixel PX4. The single pixel signals obtained from the first to fourth photodiodes PD1 to PD4 of the first to fourth unit pixels PX1 to PX4 may be summed and may be used for autofocusing in the left and right directions and the upward and downward directions.

In a time period between t4 and t5, the logic circuit may perform a second read operation S2 of obtaining a first summed pixel signal from each of the plurality of unit pixels PX in the first mode. When the switch control signal SG is activated again in the time period between t5 and t6, the logic circuit may perform a third read operation S3 for obtaining a second summed pixel signal from each of the plurality of unit pixels PX in the second mode. The summed pixel signals obtained by the second and third read operations S2 and S3 may be used to generate an image. An image having a high dynamic range (HDR) may be generated using the first summed pixel signal having a high conversion gain and the second summed pixel signal having a low conversion gain. The reset signals, the single pixel signal, the first summed pixel signal and the second summed pixel signal may correspond to decreases of ramp signals RAMP_1 and RAMP_2 in the time periods.

Referring to FIG. 20, the image sensor in an example embodiment may operate in R1R2S1S2S3S4 mode by using the DCG function. The autofocusing operation of the image sensor may be similar to the autofocusing operation illustrated in FIG. 16. For example, the single pixel signal obtained from the second photodiode PD2 of the first unit pixel PX1 in the first read operation S1, the dual pixel signal obtained from the second and fourth photodiodes PD2 and PD4 of the first unit pixel PX1 in the second read operation S2, and the summed pixel signal obtained from the first unit pixel PX1 in the third read operation S3 may be used to perform the autofocusing operation. In embodiments, the single pixel signal and the dual pixel signal obtained from the first unit pixel PX1 may be combined with the single pixel signal and the dual pixel signal obtained from the second to fourth unit pixels PX2-PX4 and may be used for autofocusing operation.

However, in FIG. 16, only a summing pixel signal having a single conversion gain may be obtained, but in FIG. 20, a first summed pixel signal having a relatively high conversion gain and a second summed pixel signal having a relatively low conversion gain during the third read operation S3 and the fourth read operation S4. An image having a high dynamic range may be generated using the first and second summed pixel signals.

Figure 21:
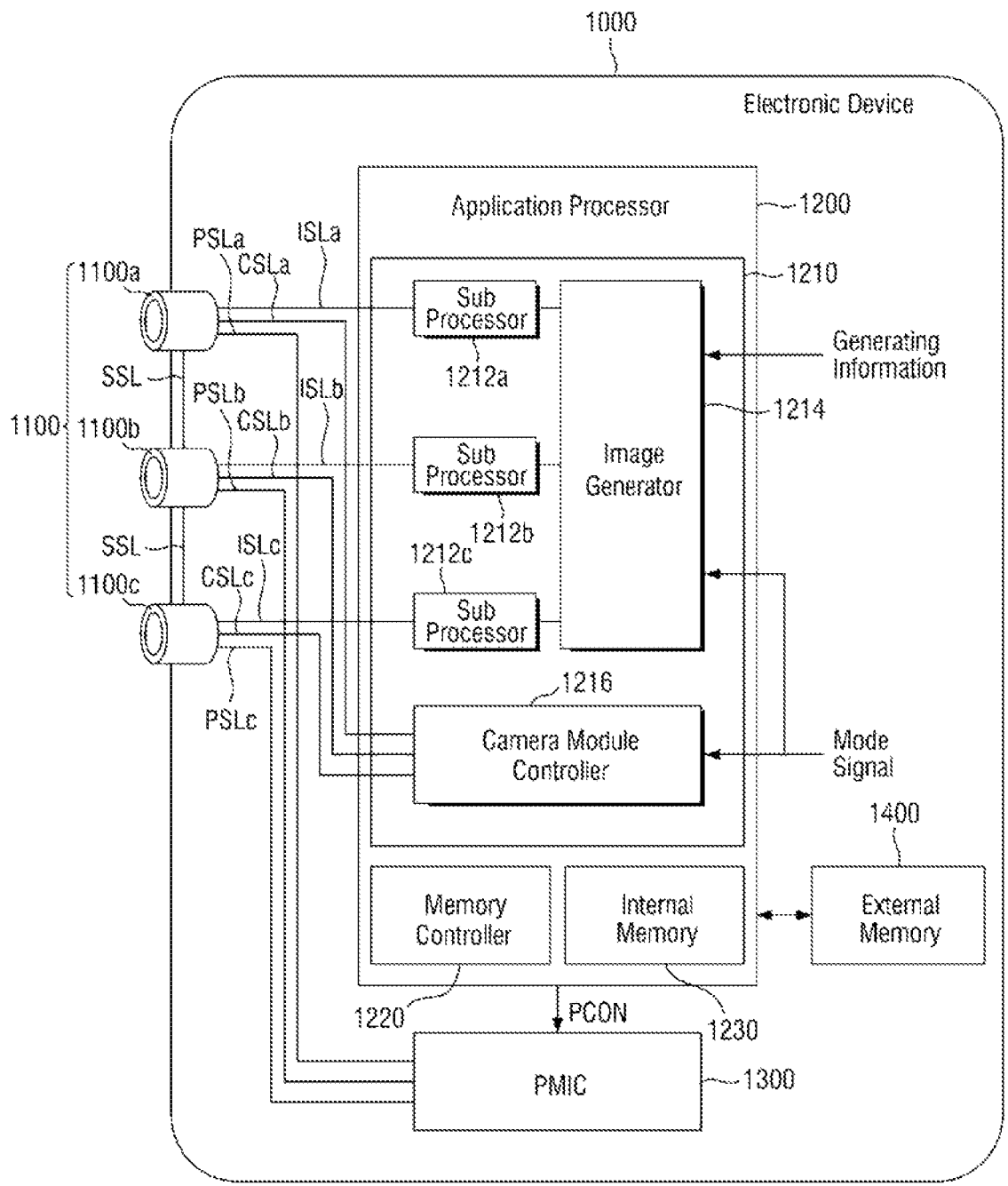
FIGS. 21 and 22 are diagrams illustrating an electronic device including an image sensor, according to an embodiment.
Figure 22:
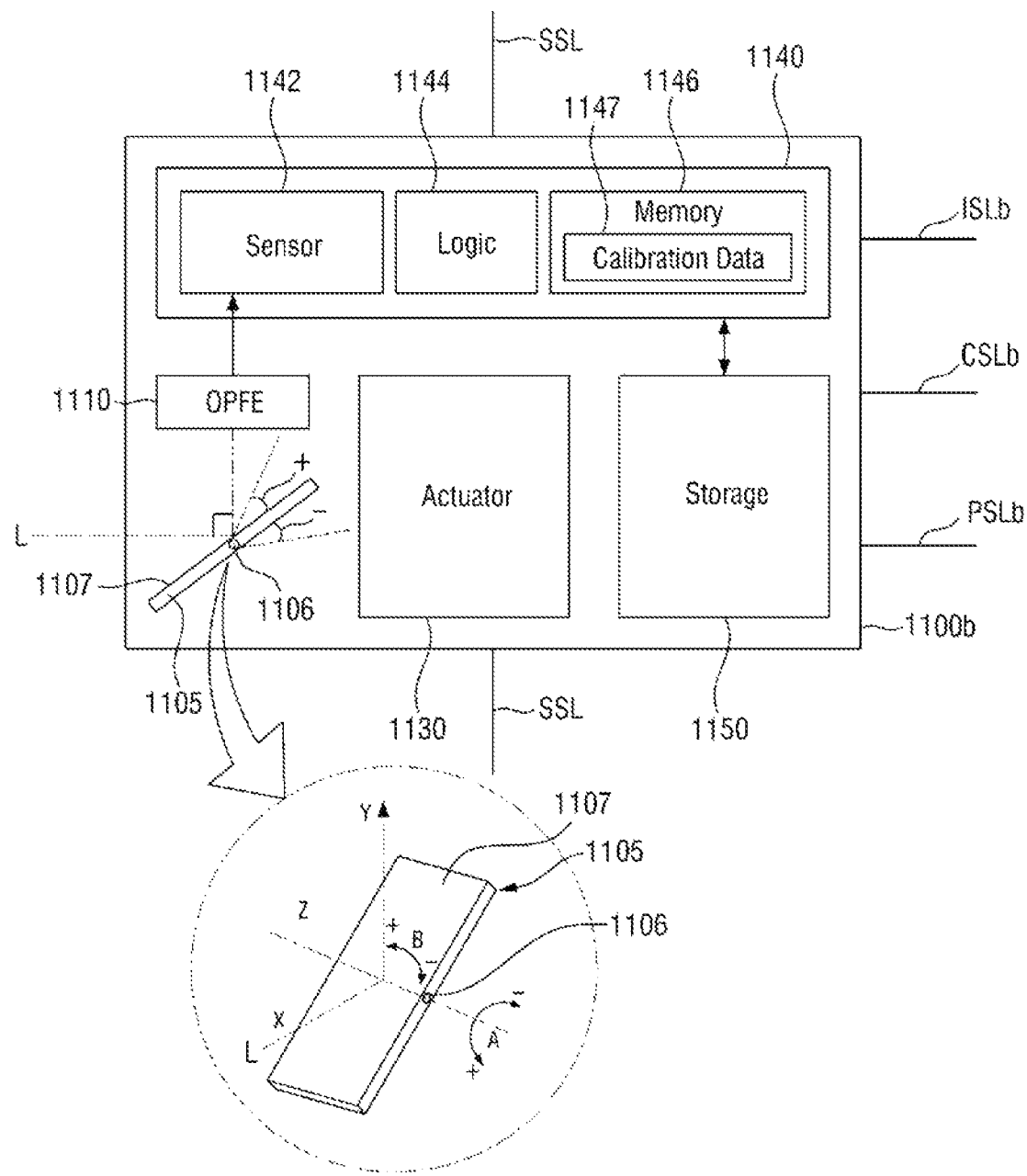

FIGS. 21 and 22 are diagrams illustrating an electronic device including an image sensor.

Referring to FIG. 21, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. In the diagram, three camera modules 1100a, 1100b, and 1100c are disposed, but embodiments are not limited thereto. In example embodiments, the camera module group 1100 may be modified to include only two camera modules. Also, in example embodiments, the camera module group 1100 may be modified to include n number of camera modules, where n may be a natural number equal to or greater than 4. Also, in an example embodiment, at least one of the plurality of camera modules 1100a, 1100b, and 1100c included in the camera module group 1100 may include an image sensor according to one of the aforementioned example embodiments described with reference to FIGS. 1 to 20.

Hereinafter, the configurations of the camera module 1100b will be described in greater detail with reference to FIG. 22, and the descriptions below will also be applied to the other camera modules 1100a and 1100b in the example embodiment.

Referring to FIG. 22, the camera module 1100b may include a prism 1105, an optical path folding element (OPFE) 1110, an actuator 1130, an image sensing device 1140 and storage 1150.

The prism 1105 may include a reflective surface 1107 of a light reflective material and may modify a path of incident light L.

In example embodiments, the prism 1105 may change the path of light L incident in the X-axis direction in the Y-axis direction perpendicular to the X-axis direction. Also, the prism 1105 may rotate a reflective surface 1107 of light reflective material in the A-direction about the central axis 1106 or may rotate the central axis 1106 in the B-direction such that the path of light L incident in the X-axis direction may change to be in the Y-axis direction. In this case, the OPFE 1110 may also move in the X-axis direction and the Z-axis direction perpendicular to the Y-axis direction.

In example embodiments, as illustrated, a maximum rotation angle of the prism 1105 in the A direction may be 15 degrees or less in the positive (+) A direction, and may be greater than 15 degrees in the negative (−) A direction, but embodiments are not limited thereto.

In example embodiments, the prism 1105 may move by around 20 degrees, an angle between 10 degrees and 20 degrees, or an angle between 15 and 20 degrees in a positive (+) or negative (−) B direction, and as for the moving angle, the prism 1105 may move by the same angle in the positive (+) or negative (−) B direction or by the similar angle in the range of 1 degree or less.

In example embodiments, the prism 1105 may move the reflective surface 1107 of a light reflective material in the Z-axis direction parallel to the extension direction of the central axis 1106.

The OPFE 1110 may include, for example, an optical lens including m number of groups where m may be a natural number. The m number of lenses may move in the third direction and may change an optical zoom ratio of the camera module 1100b. For example, when a basic optical zoom magnification of the camera module 1100b is defined as Z, when the m number of optical lenses included in the OPFE 1110 are moved, the optical zoom magnification of the camera module 1100b may change to an optical zoom magnification of 3Z, 5Z or higher.

The actuator 1130 may move the OPFE 1110 or an optical lens to a specific position. For example, the actuator 1130 may adjust the position of the optical lens such that the sensor 1142 may be disposed at a focal length of the optical lens for accurate sensing. As an example, the sensor 1142 may be configured as an image sensor.

The image sensing device 1140 may include a sensor 1142, a control logic 1144, and a memory 1146. The sensor 1142 may sense an image of a sensing target using light L provided through an optical lens. The control logic 1144 may control the overall operation of the camera module 1100b. For example, the control logic 1144 may control operation of the camera module 1100b according to a control signal provided through the control signal line CSLb.

The memory 1146 may store information necessary for operation of the camera module 1100b, such as calibration data 1147. The calibration data 1147 may include information necessary for the camera module 1100b to generate image data using light L provided from the outside. The calibration data 1147 may include, for example, information about a degree of rotation described above, information about a focal length, and information about an optical axis. When the camera module 1100b is implemented in the form of a multi-state camera in which a focal length changes according to the position of the optical lens, the calibration data 1147 may include an focal length value for each position (or state) of the optical lens and information related to autofocusing.

The storage 1150 may store image data sensed by the sensor 1142. The storage 1150 may be disposed externally of the image sensing device 1140, and may be implemented in a stacked form with a sensor chip included in the image sensing device 1140. In example embodiments, the storage 1150 may be implemented as an electrically erasable programmable read-only memory (EEPROM), but embodiments are not limited thereto.

Referring to FIGS. 21 and 22 together, in example embodiments, each of the plurality of camera modules 1100a, 1100b, and 1100c may include an actuator 1130. Accordingly, each of the plurality of camera modules 1100a, 1100b, and 1100c may include the same or different calibration data 1147 according to operation of the actuator 1130 included therein.

In example embodiments, the camera module (e.g., 1100b) of the plurality of camera modules 1100a, 1100b, and 1100c may be configured as a folded lens-type camera module in a folded lens form including the prism 1105 and the OPFE 1110 described above, and the other camera modules (e.g., 1100a, 1100c) may be configured as a vertical-type camera module which does not include the prism 1105 and the OPFE 1110, but embodiments are not limited thereto.

In example embodiments, the camera module (e.g., 1100c) of the plurality of camera modules (1100a, 1100b, and 1100c) may be formed as, for example, a vertical-type depth camera extracting depth information using infrared rays (IR). In this case, the application processor 1200 may generate a 3D depth image by merging the image data provided from the depth camera and the image data provided from the other camera module (e.g., 1100a or 1100b).

In example embodiments, at least two camera modules (e.g., 1100a and 1100b) among the plurality of camera modules 1100a, 1100b, and 1100c may have different fields of view (viewing angle). In this case, for example, optical lenses of at least two camera modules (e.g., 1100a and 1100b) among the plurality of camera modules 1100a, 1100b, and 1100c may be different from each other, but embodiments are not limited thereto.

Also, in example embodiments, fields of view of the plurality of camera modules 1100a, 1100b, and 1100c may be different. In this case, the optical lenses included in the plurality of camera modules 1100a, 1100b, and 1100c may also be different, but embodiments are not limited thereto.

In example embodiments, the plurality of camera modules 1100a, 1100b, and 1100c may be configured to be physically isolated from each other. That is, the independent sensor 1142 may be disposed in each of the plurality of camera modules 1100a, 1100b, and 1100c, rather than using the sensing region of the single sensor 1142 by the plurality of camera modules 1100a, 1100b, and 1100c in a divided manner.

Referring back to FIG. 21, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented as separate semiconductor chips.

The image processing device 1210 may include a plurality of sub-processors 1212a, 1212b, and 1212c, an image generator 1214, and a camera module controller 1216.

The image processing device 1210 may include a plurality of sub-processors 1212a, 1212b, and 1212c corresponding to the number of the plurality of camera modules 1100a, 1100b, and 1100c.

Image data generated by each of the camera modules 1100a, 1100b, and 1100c may be provided to the corresponding sub-processors 1212a, 1212b, and 1212c through image signal lines ISLa, ISLb, and ISLc isolated from each other. For example, image data generated by the camera module 1100a may be provided to the sub-processor 1212a through an image signal line ISLa, image data generated by the camera module 1100b may be provided to the sub-processor 1212b through the image signal line ISLb, and image data generated by the camera module 1100c may be provided to the sub-processor 1212b through the image signal line ISLc. Such image data transmission may be performed using, for example, a camera serial interface (CSI) based on a mobile industry processor interface (MIPI), but embodiments are not limited thereto.

In example embodiments, a sub-processor may be arranged to correspond to a plurality of camera modules. For example, the sub-processor 1212a and the sub-processor 1212c may be implemented as an integrated sub-processor rather than being implemented separately from each other as illustrated, and the image provided from the camera module 1100a and the camera module 1100c may be selected through a select device (e.g., a multiplexer) and may be provided to the integrated sub-processor.

The image data provided to each of the sub-processor 1212a, 1212b, and 1212c may be provided to the image generator 1214. The image generator 1214 may generate an output image using image data provided from each of the sub-processor 1212a, 1212b, and 1212c according to image generating information or a mode signal.

Specifically, the image generator 1214 may generate an output image by merging at least a portion of the image data generated by the camera modules 1100a, 1100b, and 1100c having different fields of view according to the image generating information or the mode signal. Also, the image generator 1214 may generate an output image by selecting one of pieces of image data generated by the camera modules 1100a, 1100b, and 1100c having different fields of view according to image generating information or a mode signal.

In example embodiments, the image generating information may include a zoom signal or zoom factor. Also, in example embodiments, the mode signal may be configured as, for example, a signal based on a mode selected by a user.

When the image generating information is a zoom signal, or zoom factor, and each of the camera modules 1100a, 1100b, and 1100c has different fields of view, or viewing angles, the image generator 1214 may perform different operations depending on types of the zoom signal. For example, when the zoom signal is the first signal, the image data output by the camera module 1100a may be merged with the image data output by the camera module 1100c, and thereafter, an output image may be output using the merged image signal and image data output by the camera module 1100b which has not be used in the merging. When the zoom signal is a second signal different from the first signal, the image generator 1214 may not perform the image data merging, and may generate an output image by selecting one of pieces of image data output by each of the camera module 1100a, 1100b, and 1100c. However, embodiments are not limited thereto, and a method of processing image data may be modified.

In example embodiments, the image generator 1214 may receive a plurality of pieces of image data having different exposure times from at least one of the plurality of sub-processors 1212a, 1212b, and 1212c, and may perform a high dynamic range (HDR) processing, thereby generating merged image data having an increased dynamic range.

The camera module controller 1216 may provide a control signal to each of the camera modules 1100a, 1100b, and 1100c. the control signal generated by the camera module controller 1216 may be provided to the corresponding camera modules 1100a, 1100b, and 1100c through control signal lines CSLa, CSLb, and CSLc isolated from each other.

One of the plurality of camera modules 1100a, 1100b, and 1100c may be designated as a master camera (e.g., 1100b) according to image generating information or a mode signal including a zoom signal, and the other camera modules (e.g., 1100a and 1100c) may be designated as slave cameras. Such information may be included in the control signal and may be provided to the corresponding camera modules 1100a, 1100b, and 1100c through the control signal lines CSLa, CSLb, and CSLc isolated from each other.

The camera module operating as a master camera and a slave camera may change according to a zoom factor or an operation mode signal. For example, when the field of view of the camera module 1100a is wider than that of the camera module 1100b and the zoom factor exhibits a low zoom magnification, the camera module 1100b may operate as a master camera, and the camera module 1100a may operate as a slave camera. Alternatively, when the zoom factor exhibits a high zoom magnification, the camera module 1100a may operate as a master camera and the camera module 1100b may operate as a slave camera.

In example embodiments, the control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit a sync enable signal to the camera module 1100b. The camera module 1100b receiving the sync enable signal may generate a sync signal based on the received sync enable signal, and may provide the generated sync signal to the camera modules 1100a and 1100c. The camera module 1100b and the camera modules 1100a and 1100c may be synchronized with the sync signal and may transmit image data to the application processor 1200.

In example embodiments, the control signal provided from the camera module controller 1216 to the plurality of camera modules 1100a, 1100b, and 1100c may include mode information according to the mode signal. The plurality of camera modules 1100a, 1100b, and 1100c may operate in the first operation mode and the second operation mode in relation to the sensing speed based on the mode information.

In a first operation mode, the plurality of camera modules 1100a, 1100b, and 1100c may generate an image signal at a first speed (e.g., generating an image signal at a first frame rate), may encode the signal at a second speed higher than the first speed (e.g., encoding an image signal having a second frame rate higher than the first frame rate), and may transmit the image signal to the application processor 1200. In this case, the second speed may be 30 times or less of the first speed.

The application processor 1200 may store the received image signal, that is, the encoded image signal in the internal memory 1230 or an external memory 1400 externally of the application processor 1200, and thereafter, may read out and decode the encoded image signal from the internal memory 1230 or the external memory 1400, and may display image data generated based on the decoded image signal. For example, a corresponding sub-processor among the plurality of sub-processors 1212*a*, 1212*b*, and 1212*c* of the image processing device 1210 may perform decoding, and may also perform image processing on the decoded image signal.

The plurality of camera modules 1100*a*, 1100*b*, and 1100*c* may generate an image signal at a third rate lower than the first rate in the second operation mode (e.g., generating an image signal at a third frame rate lower than the first frame rate) and may transmit the image signal to the application processor 1200. The image signal provided to the application processor 1200 may be an unencoded signal. The application processor 1200 may perform image processing on the received image signal or may store the image signal in the internal memory 1230 or the external memory 1400.

The PMIC 1300 may supply power, for example, a power supply voltage, to each of the plurality of camera modules 1100*a*, 1100*b*, and 1100*c*. For example, the PMIC 1300 may supply first power to the camera module 1100*a* through the power signal line PSLa, may supply second power to the camera module 1100*b* through the power signal line PSLb, and may supply third power to the camera module 1100*c* through the power signal line PSLc under control of the application processor 1200.

The PMIC 1300 may generate power corresponding to each of the plurality of camera modules 1100*a*, 1100*b*, and 1100*c* in response to the power control signal PCON from the application processor 1200, and may also adjust the level of power. The power control signal PCON may include a power adjustment signal for each operation mode of the plurality of camera modules 1100*a*, 1100*b*, and 1100*c*. For example, the operation mode may include a low power mode, and in this case, the power control signal PCON may include information about a camera module operating in the low power mode and a determined power level. The levels of powers provided to each of the plurality of camera modules 1100*a*, 1100*b*, and 1100*c* may be the same or different. Also, the level of power may change dynamically.

According to the aforementioned example embodiments, an image sensor may, by reducing the number pixel signal reading operations required to perform an autofocusing operation, reduce a frame period and may reduce power consumption.

The image sensor may obtain autofocusing information in the upward and downward directions and the left and right directions through a small number of pixel signal read operations.

While example embodiments have been illustrated and described above, it will be apparent to those skilled in the art that modifications and variations could be made without departing from the scope of the present disclosure as defined by the appended claims.

What is claimed is:

1. An image sensor, comprising:
   a pixel array including a plurality of unit pixels arranged in parallel with an upper surface of a substrate, the substrate comprising a lower surface opposite to the upper surface, wherein each unit pixel of the plurality of unit pixels includes a color filter disposed on the upper surface, and a microlens disposed on the color filter, and wherein in the each unit pixel, the substrate includes a plurality of photodiodes in a 2×2 arrangement divided by a device isolation film; and
   a logic circuit including a readout circuit configured to:
   obtain a reset signal from the each unit pixel,
   obtain a single pixel signal from a photodiode of the plurality of photodiodes included in the each unit pixel,
   obtain a summed pixel signal from the each unit pixel, and
   perform an autofocusing operation based on the single pixel signal and the summed pixel signal,
   wherein a photodiode used to obtain the single pixel signal in a first unit pixel is disposed in a first position in the 2×2 arrangement in the first unit pixel, and
   wherein a photodiode used to obtain the single pixel signal in a second unit pixel is disposed in a second position different from the first position in the 2×2 arrangement in the second unit pixel.

2. The image sensor of claim 1, wherein the readout circuit is further configured to perform the autofocusing operation in an upward direction, a downward direction, a left direction, and a right direction based on the single pixel signal and the summed pixel signal.

3. The image sensor of claim 2, wherein, in the each unit pixel, the plurality of photodiodes includes a first photodiode disposed on an upper left side, a second photodiode disposed on an upper right side, a third photodiode disposed on a lower left side, and a fourth photodiode disposed a lower right side,
   wherein the plurality of unit pixels includes the first unit pixel, the second unit pixel, a third unit pixel, and a fourth unit pixel disposed in different rows, and
   wherein the readout circuit is further configured to obtain single pixel signals from a second photodiode of the first unit pixel, a first photodiode of the second unit pixel, a fourth photodiode of the third unit pixel, and a third photodiode of the fourth unit pixel, and to perform the autofocusing operation according to a result of combining the single pixel signals.

4. The image sensor of claim 3, wherein the readout circuit is further configured to obtain an upper-side signal by combining the single pixel signals obtained from the first photodiode of the second unit pixel and the second photodiode of the first unit pixel, to obtain a lower-side signal by combining the single pixel signals obtained from the third photodiode of the fourth unit pixel and the fourth photodiode of the third unit pixel, and to perform the autofocusing operation in the upward direction and the downward direction using the upper-side signal and the lower-side signal.

5. The image sensor of claim 3, wherein the readout circuit is further configured to obtain a left-side signal by combining the single pixel signals obtained from the first photodiode of the second unit pixel and the third photodiode of the fourth unit pixel, to obtain a right-side signal by combining the single pixel signals obtained from the second photodiode of the first unit pixel and the fourth photodiode of the third unit pixel, and to perform the autofocusing operation in the left direction and the right direction using the left-side signal and the right-side signal.

6. The image sensor of claim 3, wherein the readout circuit is further configured to simultaneously obtain the single pixel signals from two or more unit pixels from among the first to fourth unit pixels, and
   wherein the readout circuit includes two or more analog-to-digital converters configured to convert the single pixel signals into digital signals.

7. The image sensor of claim 3, wherein the first to fourth unit pixels are disposed in a same column in the pixel array.

8. The image sensor of claim 2, wherein a number of pixel signals used for the autofocusing operation in the upward direction and downward directions is equal to a number of pixel signals used for the autofocusing operation in the left direction and the right direction.

9. The image sensor of claim 1, wherein the plurality of unit pixels includes a plurality of metal wirings to which a control signal is applied, and
wherein the readout circuit is further configured to select a photodiode for obtaining the single pixel signal from the each unit pixel based on a connection relationship between the plurality of metal wirings.

10. The image sensor of claim 9, wherein the plurality of unit pixels include a first unit pixel and a second unit pixel, and a control signal applied to a gate electrode of a transfer transistor connected to a first photodiode in the first unit pixel is also applied to a gate electrode of a transfer transistor connected to a second photodiode in the second unit pixel, and
wherein the first photodiode is disposed in a position with respect to the first unit pixel which is different from a position of the second photodiode with respect to the second unit pixel.

11. The image sensor of claim 1, wherein the readout circuit includes an analog-to-digital converter configured to convert the single pixel signal into a first digital signal and to convert summed pixel signal into a second digital signal, and
wherein a number of bits included in the first digital signal is less than a number of bits included in the second digital signal.

12. The image sensor of claim 1, wherein the first position comprises an upper-left position in the 2×2 arrangement in the first unit pixel, and
wherein the second position comprises a lower-right position in the 2×2 arrangement in the second unit pixel.

13. An image sensor, comprising:
a pixel array including a plurality of unit pixels arranged in parallel with an upper surface of a substrate, the substrate including a lower surface opposite to the upper surface, wherein each unit pixel of the plurality of unit pixels includes a color filter disposed on the upper surface, and a microlens disposed on the color filter, and wherein in the each unit pixel, the substrate includes a plurality of photodiodes in a 2×2 arrangement divided by a device isolation film; and
a logic circuit including a readout circuit configured to:
obtain a reset signal from the each unit pixel,
obtain a single pixel signal from a photodiode of the plurality of photodiodes included in the each unit pixel,
obtain a dual pixel signal from two adjacent photodiodes from among the plurality of photodiodes included in the each unit pixel, and
obtain a summed pixel signal from the each unit pixel,
wherein the readout circuit includes an analog-to-digital converter configured to convert the single pixel signal into a first digital signal, to convert the dual pixel signal into a second digital signal, and to convert the summed pixel signal into a third digital signal, and
wherein a magnitude of the first digital signal and a magnitude of the second digital signal are smaller than a magnitude of the third digital signal.

14. The image sensor of claim 13,
wherein, in the each unit pixel, the plurality of photodiodes includes a first photodiode disposed on an upper left side, a second photodiode disposed on an upper right side, a third photodiode disposed on a lower left side, and a fourth photodiode disposed a lower right side,
wherein the plurality of unit pixels includes a first unit pixel, a second unit pixel, a third unit pixel, and a fourth unit pixel disposed in different rows, and
wherein the readout circuit is further configured to obtain single pixel signals from a second photodiode of the first unit pixel, a first photodiode of the second unit pixel, a fourth photodiode of the third unit pixel, and a third photodiode of the fourth unit pixel.

15. The image sensor of claim 14, wherein the readout circuit is further configured to obtain dual pixel signals from second and fourth photodiodes of the first unit pixel and the third unit pixel, and first and third photodiodes of the second unit pixel and the fourth unit pixel.

16. The image sensor of claim 15, wherein the readout circuit is further configured to use the dual pixel signals obtained from the second and fourth photodiodes of the first unit pixel and the third unit pixel as a right-side signal, to obtain a left-side signal by subtracting the dual pixel signals from a summed pixel signal obtained from the first unit pixel and the third unit pixel, and to perform an autofocusing operation in a left and a right direction using the right-side signal and the left-side signal.

17. The image sensor of claim 14, wherein the readout circuit is further configured to obtain an upper-side signal by summing single pixel signals obtained from the second photodiode of the first unit pixel and the first photodiode of the second unit pixel, to obtain a lower-side signal by subtracting the upper-side signal from one of the summed pixel signals of the first and second unit pixels, and to perform an autofocusing operation in an upward direction and a downward direction using the upper-side signal and the lower-side signal.

18. The image sensor of claim 13, wherein the readout circuit is configured to selectively perform an operation of obtaining the dual pixel signal.

19. An image sensor, comprising:
a pixel array including a plurality of unit pixels arranged in parallel with a upper surface of a substrate, wherein, in each unit pixel of the plurality of unit pixels, the substrate includes a plurality of photodiodes in a 2×2 arrangement divided by a device isolation film; and
a logic circuit configured to:
perform an operation of reading out the plurality of unit pixels in a first mode in which a floating diffusion region of the each unit pixel has a first capacitance, and
perform the operation of reading out the plurality of unit pixels in a second mode in which the floating diffusion region of the each unit pixel has a second capacitance greater than the first capacitance,
wherein the logic circuit includes a readout circuit configured to:
obtain a reset signal in the first mode in sequence with a reset signal in the second mode,
obtain a single pixel signal from a photodiode of the plurality of photodiodes included in the each unit pixel in the first mode,
obtain a first summed pixel signal from the each unit pixel in the first mode, and
obtain a second summed pixel signal from the each unit pixel in the second mode.

20. The image sensor of claim 19, wherein a photodiode corresponding to the single pixel signal is disposed in different positions in the plurality of unit pixels.

21. The image sensor of claim 19, wherein the readout circuit is further configured to obtain the single pixel signal in the first mode, and to obtain a dual pixel signal from two adjacent photodiodes from among the plurality of photodiodes included in the each unit pixel in the first mode.

* * * * *